(12) United States Patent
Lee et al.

(10) Patent No.: US 8,324,677 B2
(45) Date of Patent: Dec. 4, 2012

(54) NONVOLATILE MEMORY DEVICE AND METHOD OF MANUFACTURING THE SAME

(75) Inventors: Sunwoo Lee, Incheon (KR); Sangwoo Lee, Seoul (KR); Changwon Lee, Gwacheon-si (KR); Jeonggil Lee, Goyang-si (KR)

(73) Assignee: Samsung Electronic Co., Ltd., Suwon-Si, Gyeonggi-Do (KR)

( * ) Notice: Subject to any disclaimer, the term of this patent is extended or adjusted under 35 U.S.C. 154(b) by 217 days.

(21) Appl. No.: 12/704,365

(22) Filed: Feb. 11, 2010

(65) Prior Publication Data

US 2010/0207185 A1    Aug. 19, 2010

(30) Foreign Application Priority Data

Feb. 16, 2009    (KR) .................. 10-2009-0012495

(51) Int. Cl.
*H01L 29/72* (2006.01)

(52) U.S. Cl. ........ 257/316; 257/314; 257/328; 257/401; 257/413; 257/67

(58) Field of Classification Search ............. 257/67, 257/314, 316, 328, 401, 413
See application file for complete search history.

(56) References Cited

U.S. PATENT DOCUMENTS

| 7,524,725 B2 | 4/2009 | Chung |
| 2003/0039146 A1* | 2/2003 | Choi .................. 365/185.33 |
| 2004/0084676 A1* | 5/2004 | Takaura et al. .................. 257/67 |

FOREIGN PATENT DOCUMENTS

| JP | 08-187599 | * 2/1998 |
| JP | 10-032269 | 2/1998 |
| JP | 2007-317874 | 12/2007 |
| KR | 10-0673105 | 1/2007 |

OTHER PUBLICATIONS

Translation of JP 10-032269.*
English Abstract for Publication No. 10-032269.
English Abstract for Publication No. 1020060104696 (for 10-0673105).
English Abstract for Publication No. 2007-317874.

* cited by examiner

*Primary Examiner* — Edward Wojciechowicz
(74) *Attorney, Agent, or Firm* — F. Chau & Associates, LLC

(57) ABSTRACT

A nonvolatile memory device includes gate electrodes three dimensionally arranged on a semiconductor substrate, a semiconductor pattern extending from the semiconductor substrate and crossing sidewalls of the gate electrodes, a metal liner pattern formed between the semiconductor pattern and formed on a top surface and a bottom surface of each of the gate electrodes, and a charge storage layer formed between the semiconductor pattern and the metal liner pattern.

10 Claims, 24 Drawing Sheets

NONVOLATILE MEMORY DEVICE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2009-0012495, filed on Feb. 16, 2009, the entire contents of which are hereby incorporated by reference.

BACKGROUND

1. Technical Field

The present disclosure herein relates to a nonvolatile memory device and a method of manufacturing the same, and more particularly, to a nonvolatile memory device having a three-dimensional structure and a method of manufacturing the same.

2. Discussion of Related Art

Generally, a nonvolatile memory device can electrically erase data and electrically program data, and can maintain data even when a power supply is interrupted.

Nonvolatile memory devices implement various types of memory cell transistors and can be divided into a NAND type and a NOR type according to a cell array structure. NAND type nonvolatile memory devices typically have comparatively high integration and NOR type nonvolatile memory devices typically have comparatively high speed.

In particular, NAND type nonvolatile memory devices use a cell string structure serially connecting a large number of memory cell transistors resulting in high integration. Further, NAND type nonvolatile memory devices implement simultaneous data operations (e.g., read/write, erase) and a speed of the data operations is high compared with the NOR type nonvolatile memory device. NAND type nonvolatile memory devices are typically used in a portable electronic device such as digital cameras or MP3 players that need mass storage with high integration and fast data operations. As these needs for high integration and fast data operations develop, improved NAND type nonvolatile memory devices will be needed Therefore, a need exists for a NAND type nonvolatile memory device having a three-dimensional structure.

SUMMARY

According to embodiments of the inventive concept, a nonvolatile memory device may include gate electrodes three dimensionally arranged on a semiconductor substrate, a semiconductor pattern extending from the semiconductor substrate and crossing sidewalls of the gate electrodes, a metal liner pattern formed between the semiconductor pattern and formed on a top surface and a bottom surface of each of the gate electrodes, and a charge storage layer formed between the semiconductor pattern and the metal liner pattern.

According to embodiments of the inventive concept, a method of manufacturing a nonvolatile memory device may include stacking first and second insulating layers alternately on a semiconductor substrate, penetrating the first and second insulating layers to form a semiconductor pattern connected to the semiconductor substrate, forming a trench which is spaced apart from the semiconductor pattern and penetrates the first and second insulating layers, removing the second insulating layers exposed to the trench to form extension portions exposing portions of sidewall of the semiconductor pattern between vertically adjacent ones of the first insulating layers, forming metal liner patterns conformally covering an inner wall of the extension portions, and forming gate electrodes filling the extension portions in which the metal liner patterns are formed.

According to embodiments of the inventive concept, a method of manufacturing a nonvolatile memory device includes stacking first and second insulating layers alternately on a semiconductor substrate, penetrating the first and second insulating layers to form a semiconductor layer connected to the semiconductor substrate, forming a trench which is spaced apart from the semiconductor layer and penetrates the first and second insulating layers, removing the second insulating layers exposed to the trench to form extension portions exposing portions of sidewall of the semiconductor pattern between vertically adjacent ones of the first insulating layers, forming metal liner patterns conformally covering an inner wall of the extension portions, forming gate electrodes filling the extension portions in which the metal liner patterns are formed, and patterning the semiconductor layer to form a semiconductor pattern crossing sidewalls of the gate electrode.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF EXEMPLARY EMBODIMENTS

Figure 1:
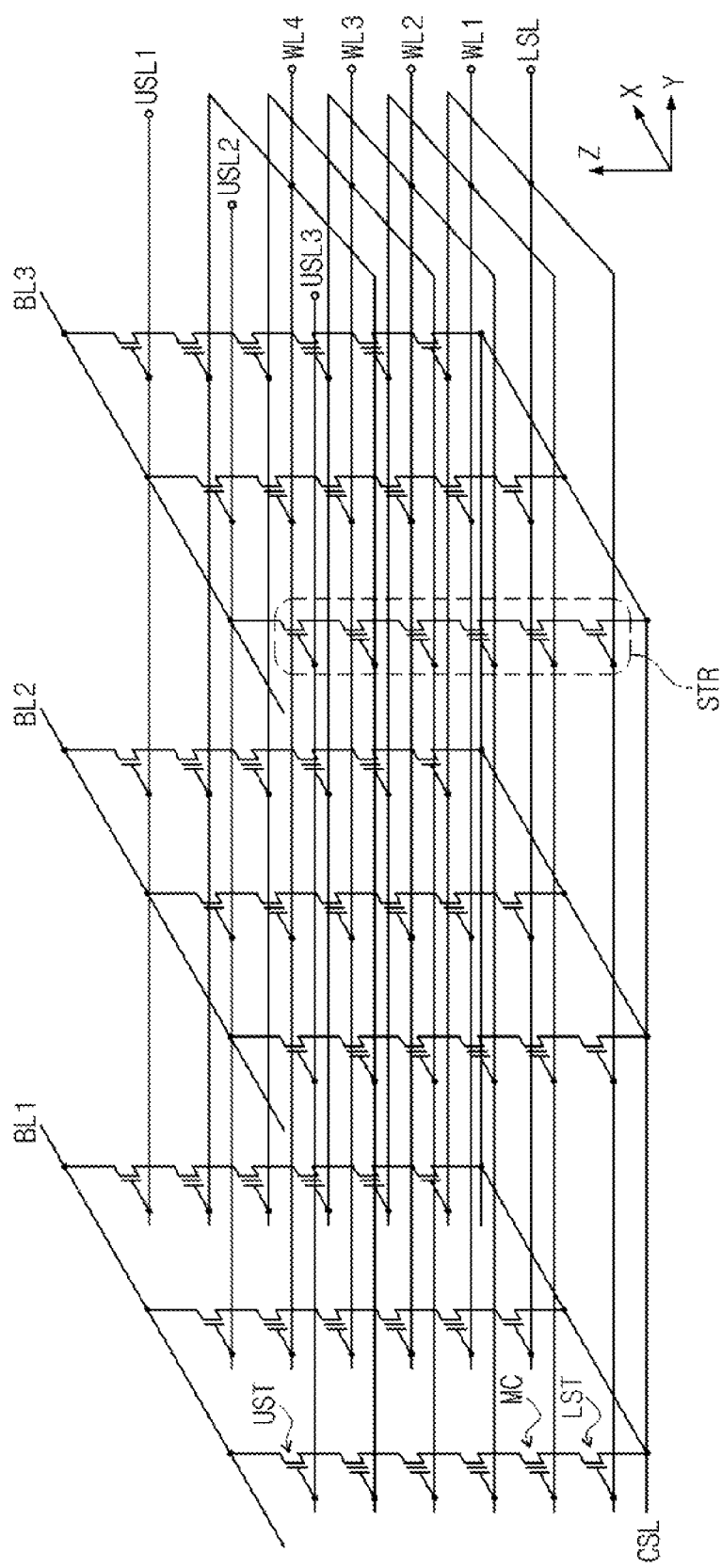
FIG. 1 is a circuit diagram of a nonvolatile memory device in accordance with an embodiment of the inventive concept.

Exemplary embodiments of the inventive concept will be described below in more detail with reference to the accompanying drawings. Embodiments of the inventive concept may, however, be implemented in different forms and should not be construed as limited to the embodiments set forth herein. Rather, embodiments are provided so that this disclosure will be thorough and complete, and will fully convey the scope of the inventive concept to those skilled in the art. Like numbers refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present disclosure.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

FIG. 1 is a circuit diagram of a nonvolatile memory device in accordance with an embodiment of the inventive concept.

Referring to FIG. 1, a nonvolatile memory device in accordance with an embodiment of the inventive concept includes a cell array including a plurality of strings (STR). The cell array includes a plurality of bit lines (BL1-BL3), a plurality of word lines (WL1-WL4), upper and lower select lines (USL1-USL3, LSL) and a common source line (CSL). The plurality of strings (STR) is disposed between the bit lines (BL1-BL3) and the common source line (CSL).

Each of the strings (STR) includes upper and lower select transistors (UST, LST) and a plurality of memory cell transistors (MC) serially connected between the upper and lower select transistors (UST, LST). Drains of the upper select transistors (UST) are connected to respective ones of the bit lines (BL1-BL3) and sources of the lower select transistors (LST) are connected to the common source line (CSL). The common source line (CSL) is a line to which sources of the lower select transistors (LST) are commonly connected.

The upper select transistors (UST) are connected to the upper select lines (USL1-USL3) and the lower select transistors (LST) are connected to the lower select line (LSL). Also, the memory cells (MC) are connected to respective ones of the word lines (WL1-WL4).

Since the cell array is arranged to have a three-dimensional structure, the strings (STR) has such a structure that the memory cells (MC) are serially connected in a z-axis perpendicular to an xy plane substantially parallel to a top surface of the substrate. Accordingly, channels of the select transistors (UST, LST) and the memory cell transistors (MC) may be formed to be substantially perpendicular to the xy plane.

In the nonvolatile memory device having a three-dimensional structure, m number of memory cells are formed on each xy plane and the xy plane having m number of memory cells is stacked in n number of layers. Here, m and n are natural numbers; m and n may be the same or different.

Figure 2A:
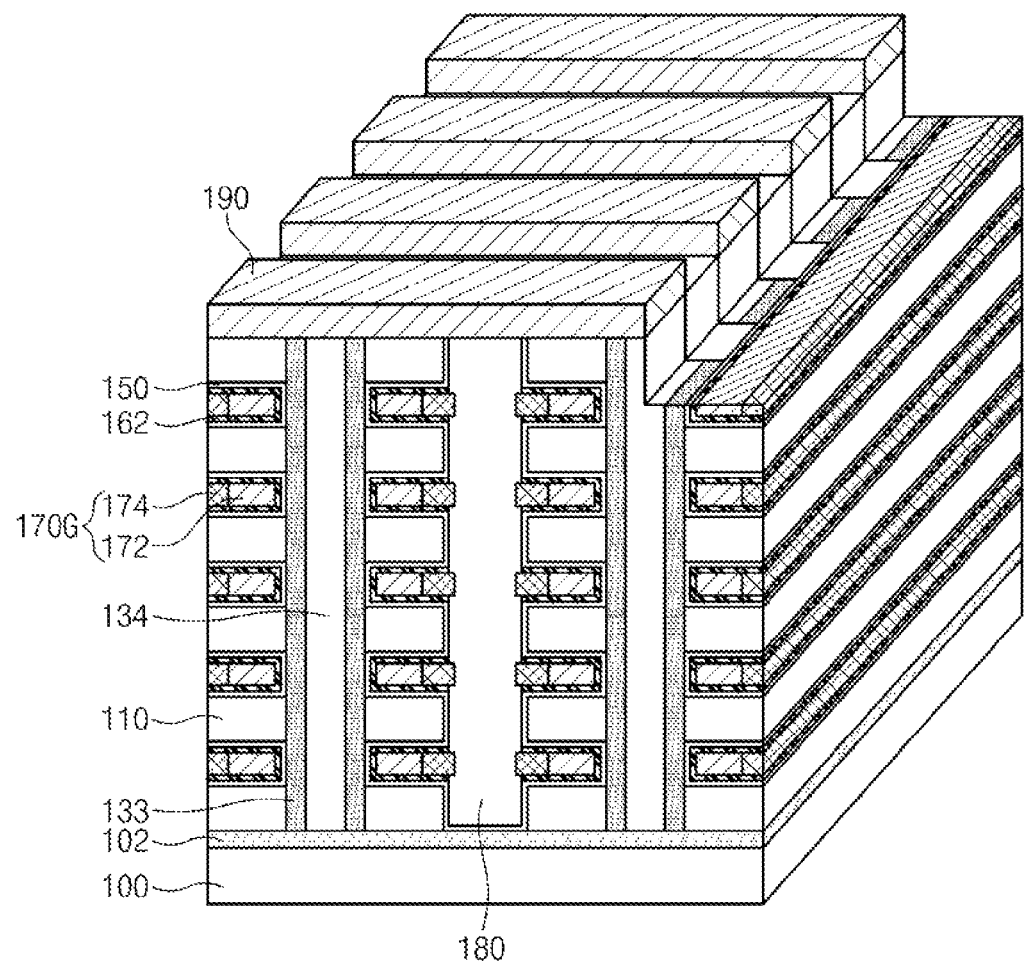
FIGS. 2A and 2B are views illustrating a nonvolatile memory device in accordance with an embodiment of the inventive concept.
Figure 2B:
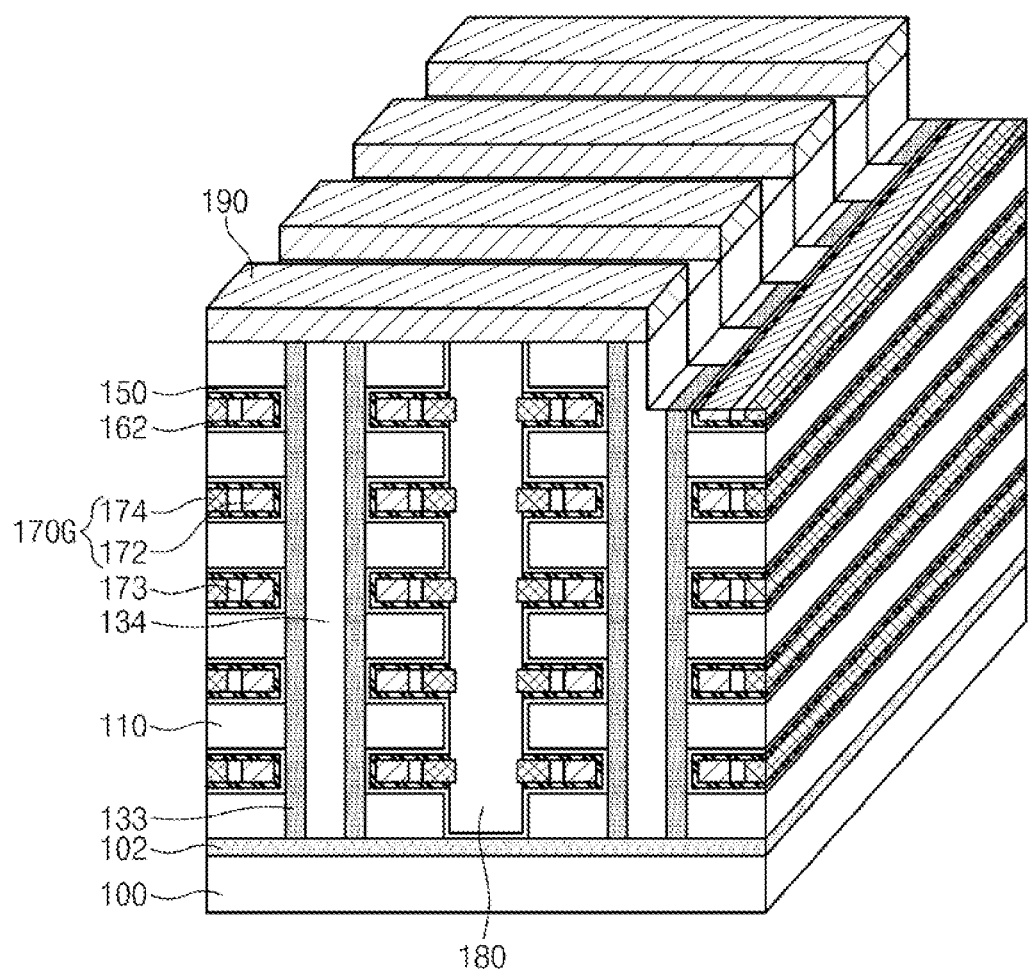

FIGS. 2A and 2B are views illustrating a nonvolatile memory device in accordance with an embodiment of the inventive concept.

Referring to FIGS. 2A and 2B, an impurity or well region 102 (herein after impurity region) which is provided as a common source line (CSL of FIG. 1) may be formed in a semiconductor substrate 100. An insulating layer and a conductive layer may be alternately and repeatedly disposed on the impurity region 102.

More specifically, the insulating layer includes insulating layer patterns 110 of a line shape and the conductive layer includes a gate electrode 170G of a line shape forming a word line. The insulating layer pattern 110 and the gate electrodes 170G may be alternately stacked on the semiconductor substrate 100 to form a stack structure of a line shape. The insulating layer patterns 110 or the gate electrodes 170G may be disposed to be horizontally spaced apart from each another. That is, the gate electrodes 170G may be three dimensionally disposed on the semiconductor substrate 100.

Channel semiconductor patterns 133 crossing the gate electrodes 170G and the insulating layer patterns 110 are disposed to be spaced apart from one another on first sidewalls of the gate electrodes 170G and the insulating layer patterns 110. An insulating layer 180 is formed on second sidewalls which are opposite the first sidewalls. Each of the channel semiconductor patterns 133 may be formed in a line shape to be perpendicular to the semiconductor substrate 100. That is, each of the channel semiconductor patterns 133 extend in a direction perpendicular to the semiconductor substrate 100 and a plurality of gate electrodes 170G is formed to cross each of the channel semiconductor patterns 133.

Since the first sidewalls of the gate electrode 170G are disposed to face each other, the channel semiconductor patterns 133 may also be disposed to face each other. An insulating layer 134 may be formed between the channel semiconductor patterns 133 facing each other. The channel semiconductor patterns 133 extending in a direction perpendicular to the semiconductor substrate 100 are electrically connected to bit lines 190 crossing the gate electrodes 170G. The bit lines 190 may be directly in contact with top surfaces of the channel semiconductor patterns 133 to be electrically connected to the channel semiconductor patterns 133 or the bit lines 190 may be electrically connected to the channel semiconductor patterns 133 through bit line contact plugs.

Each of the gate electrodes 170G is formed of a polysilicon layer 172 and a silicide layer 174 to reduce a resistance. More specifically, the polysilicon layer 172 is adjacent to the channel semiconductor pattern 133 and the silicide layer 174 is formed on one sidewall of the polysilicon layer 172. The silicide layer 174 protrudes in a direction parallel to the semiconductor substrate 100 compared with the vertically adjacent insulating patterns 110. That is, the first sidewall of the silicide layer 174 has a protrusive structure compared with the first sidewall of the insulating layer pattern 110. In an embodiment of the inventive concept, the silicide layer 174 may include a cobalt silicide layer, a nickel silicide layer or a tungsten silicide layer.

When the gate electrode 170G includes a cobalt silicide layer in an embodiment of the inventive concept, a void 173 may be formed between the polysilicon layer 172 and the silicide layer 174 as shown in FIG. 2B.

A resistance of the gate electrode 170G formed of the polysilicon layer 172 and the silicide layer 174 may be lower than a resistance of the gate electrode formed of only a polysilicon layer. Thus, an operational speed of a nonvolatile memory device of a three dimensional structure can be improved.

Also, a charge storage layer 150 and a metal liner pattern 162 are disposed between the channel semiconductor pattern 133 and the first sidewall of the gate electrode 170G.

The charge storage layer 150 may be formed between the metal liner pattern 162 and the channel semiconductor pattern 133. The charge storage layer 150 may be formed to be in contact with a surface of the channel semiconductor pattern 133. The charge storage layer 150 may be in contact with the channel semiconductor pattern 133 and may be locally formed between the insulating layer patterns 110. The charge storage layer 150 may be formed between the channel semiconductor pattern 133 and the gate electrode 170G and may be conformally formed along top surfaces, bottom surfaces and second sidewalls of the insulating layer patterns 110. The charge storage layer 150 includes a charge tunneling layer, a charge trapping layer and a charge blocking layer and may be formed so that the charge storage layer 150 is in contact with the channel semiconductor pattern 133 and the charge blocking layer is in contact with the metal liner pattern 162.

The metal liner pattern 162 may be locally formed between the insulating layer patterns 110 vertically adjacent to each other. More specifically, the metal liner pattern 162 may be formed between the gate electrode 170G and the insulating layer pattern 110. Also, the metal liner pattern 162 may be conformally formed along the first sidewall, a top surface and a bottom surface of the gate electrode 170G. The metal liner pattern 162 may cover the first sidewall, a top surface and a bottom surface of the polysilicon layer 172 and a portion of a top surface and a bottom surface of the silicide layer 174.

The metal liner pattern 162 reduces a resistance of the gate electrode 170G and may prevent an incomplete electrical connection between the silicide layer 174 and the polysilicon layer 172. When a cobalt silicide layer 174 is formed on a sidewall of the polysilicon layer 172, a void may be formed by a diffusion of cobalt atom and silicon atom. Thus, an electrical connection between the cobalt silicide layer 174 and the polysilicon layer 172 may be physically disconnected from one another. The metal liner pattern 162 is formed on a top surface and a bottom surface of the polysilicon layer 172 and the silicide layer 174 of the gate electrode 170G to electrically connect the polysilicon layer 172 and the silicide layer 174, even in the case of a physical disconnection there between.

The metal liner pattern 162 may have conductive properties and may be formed of material having a low resistance. For example, the metal liner pattern 162 may be formed of a metal nitride layer such as TiN, TaN or WN or a metal layer such as W, Al, Ti, Ta, Co or Cu.

Figure 3:
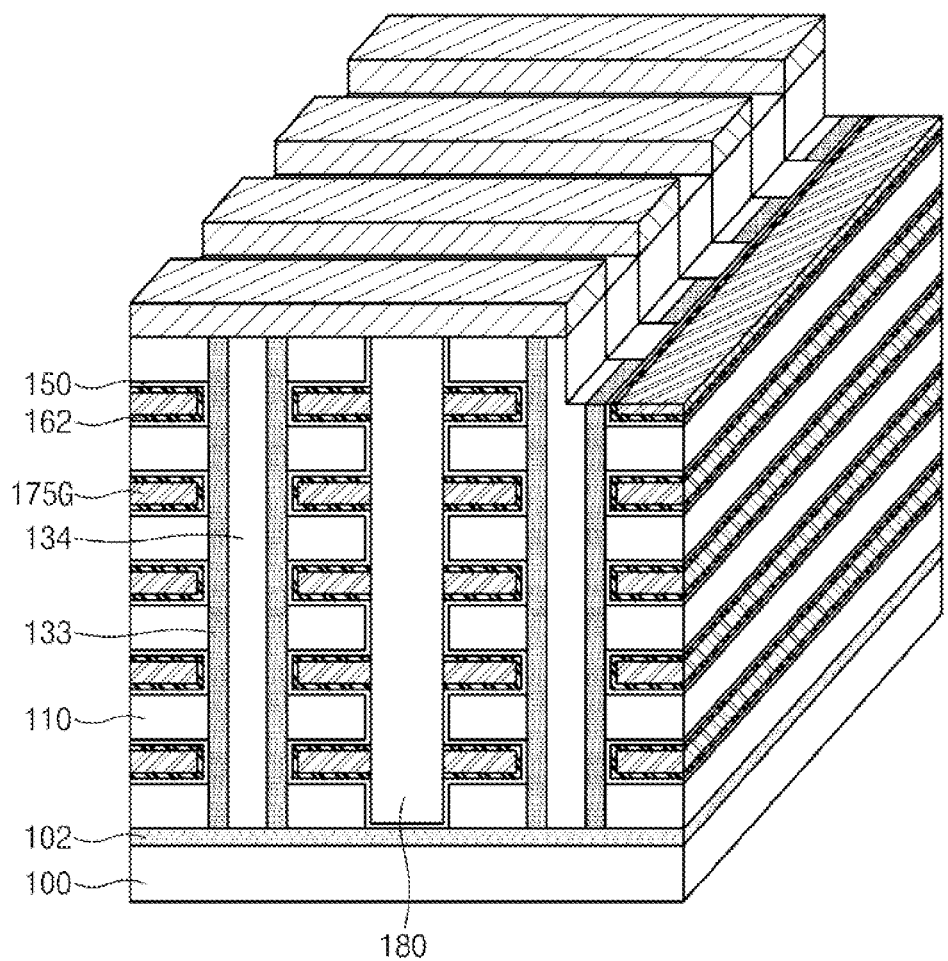
FIG. 3 is a view illustrating a nonvolatile memory device in accordance with another embodiment of the inventive concept.

FIG. 3 is a view illustrating a nonvolatile memory device in accordance with another embodiment of the inventive concept. Since the nonvolatile memory device of FIG. 3 is similar to the nonvolatile memory device of FIGS. 2A and 2B, only differences there between will be described in detail.

Referring to FIG. 3, gate electrodes 175G between the insulating layer patterns 110 may be formed of a metal layer. The gate electrodes 175G may be locally formed between the insulating layer patterns 110 vertically adjacent to each other, wherein the metal liner pattern 162 covers a first sidewall, a top surface and a bottom surface of the gate electrode 175G. More specifically, the gate electrodes 175G may be tungsten layers formed by a selective deposition method or may be cobalt layers formed by an electroless selective deposition method.

The metal liner pattern 162 locally formed between the insulating layer patterns 110 vertically adjacent to each other may be a thin film seed layer for selectively forming, the metal gate electrode 175G. The metal liner pattern 162 has a conductive property and may be formed of material having a low resistance, for example, TiN, TaN or WN.

A method of manufacturing a nonvolatile memory device in accordance with an embodiment of the inventive concept will be described in detail with reference to FIGS. 4 through 14.

FIGS. 4 through 14 are views sequentially illustrating a method of manufacturing a nonvolatile memory device in accordance with an embodiment of the inventive concept.

Figure 4:
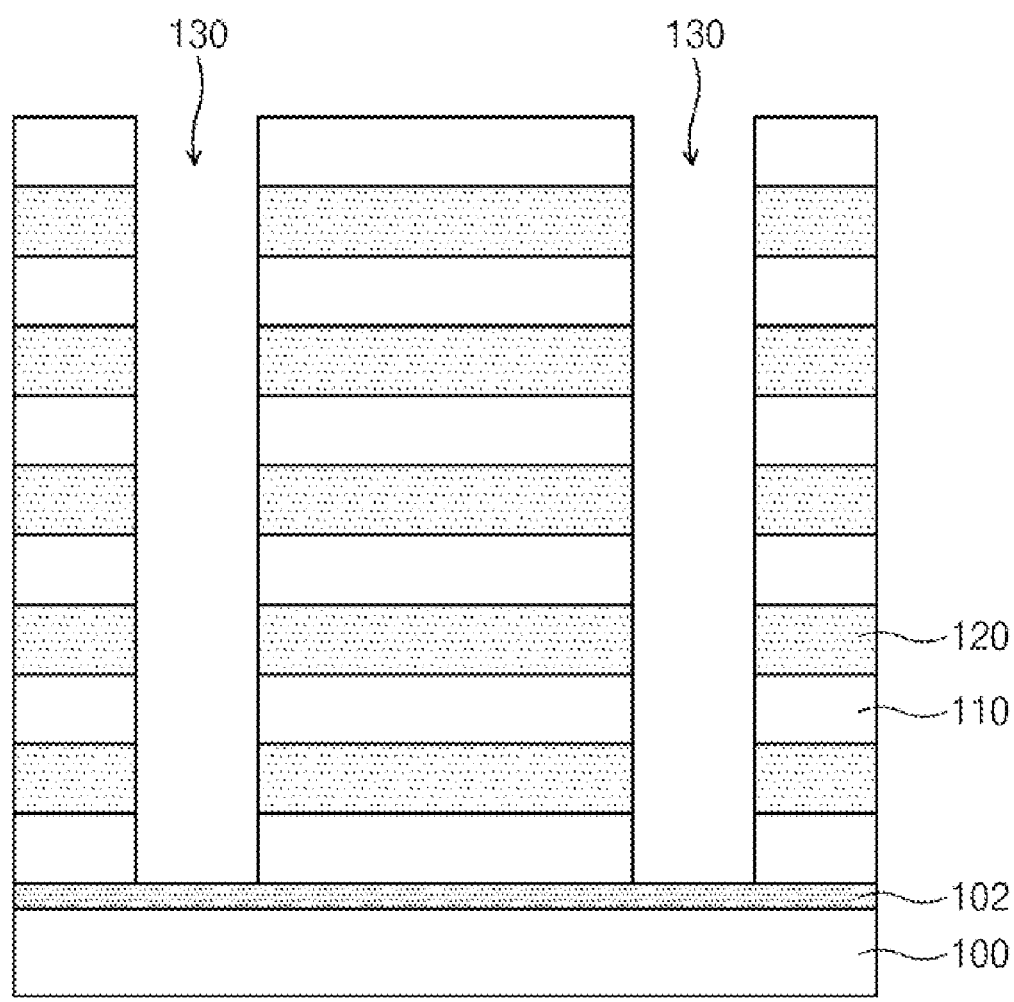
FIGS. 4 through 14 are views sequentially illustrating a method of manufacturing a nonvolatile memory device in accordance with an embodiment of the inventive concept.

Referring to FIG. 4, first and second insulating layers 110 and 120 having different wet etching rates from each other are alternately stacked on a semiconductor substrate 100. Here, the semiconductor substrate 100 may include an impurity or well region 102 (herein after impurity region) and the first and second insulating layers 110 and 120 may be alternately stacked on the impurity region. The number of layers in a stack formed of laminated first and second insulating layers 110 and 120 may vary between different implementations, for example, according to a designed memory capacity. The second insulating layer 120 may be formed of material having a wet etching rate higher than the first insulating layer 110. For example, the first and second insulating layers 110 and 120 may be formed of a silicon oxide layer and a silicon nitride layer respectively or may be formed of silicon oxide layers having different etching wet rates from each other.

First trenches 130 are formed in the first and second insulating layers 110 and 120. The first trenches 130 may be formed by a photolithography process and an etching process. The impurity region 102 of the semiconductor substrate 100 may be exposed by the first trenches 130. The first trenches 130 may be formed in a line shape and may be formed to be spaced a predetermined distance apart from one another in parallel. As the first trenches 130 are formed, first sidewalls of the laminated first and second insulating layers 110 and 120 are exposed to the first trenches 130. Instead of the first trenches 130, holes (not shown) may be formed penetrating the first and second insulating layers 110 and 120.

Figure 5:
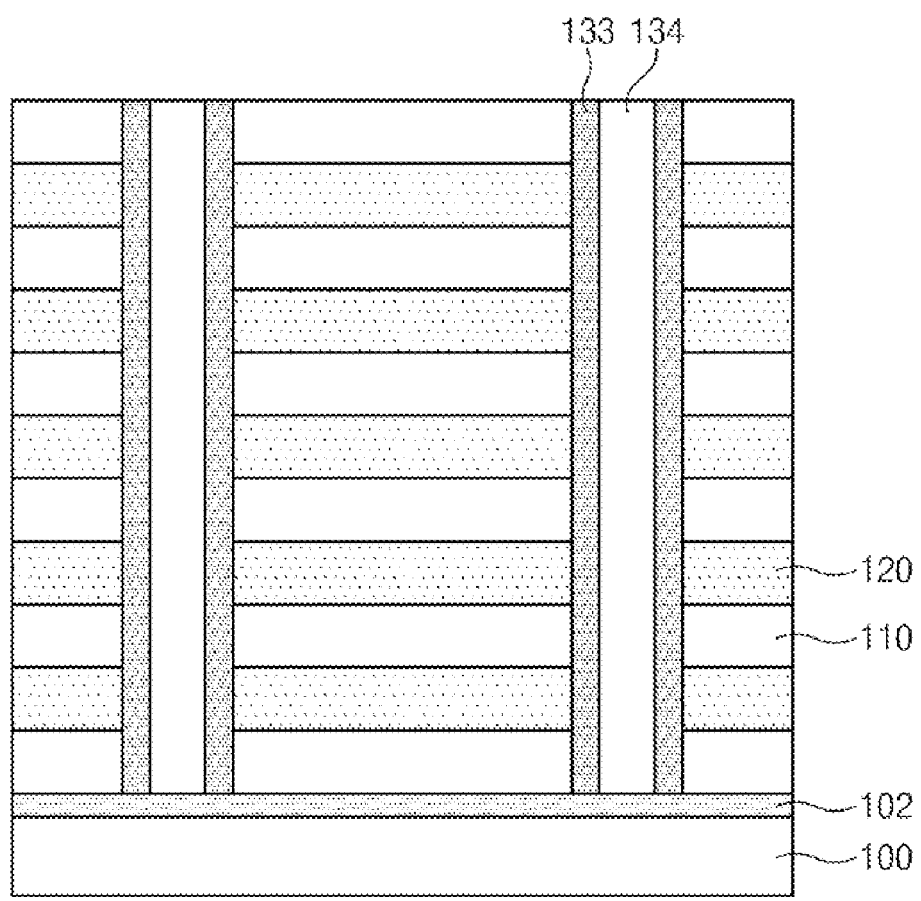

Referring to FIG. 5, a channel semiconductor layer is formed on an inner wall of the first trench 130. The channel semiconductor layer can be formed, wherein a semiconductor material is conformally deposited along the first sidewall of the laminated first and second insulating layers 110 and 120. The channel semiconductor layer is anisotropically etched to remove a portion of the channel semiconductor layer formed on the impurity region 102 and a top surface of an uppermost first insulating layer 110 of the stack. Remaining portions of the channel semiconductor layer form channel semiconductor patterns 133 covering the first sidewalls of the first and second insulating layers 110 and 120. An insulating material is formed between the channel semiconductor patterns 133 in the first trench 130 and the insulating material is planarized to form an insulating layer 134. The channel semiconductor patterns 133 may be formed through an epitaxial process using the semiconductor substrate 100 exposed by the first trench 130 as a seed layer.

Figure 6:
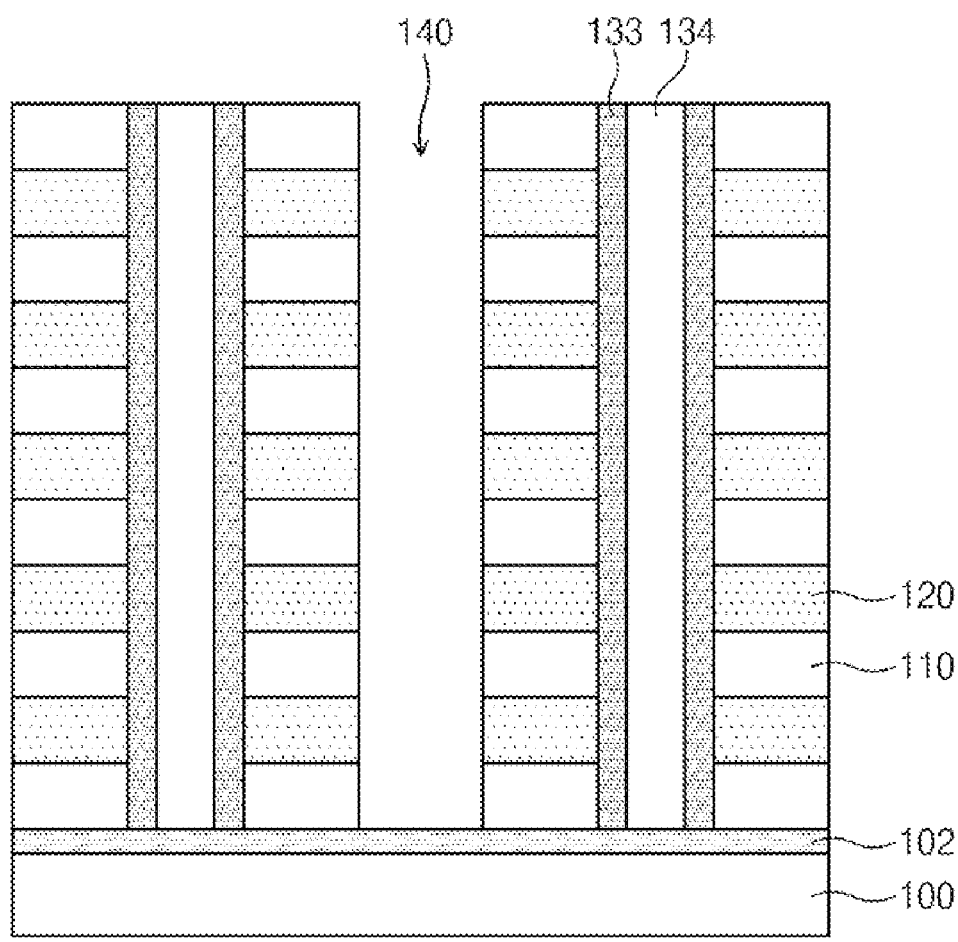

Referring to FIG. 6, second trenches 140 of a line shape are formed between the first trenches 130. That is, the second trenches 140 are formed to be substantially parallel to the first trenches 130 and can expose a second sidewall of the laminated first and second insulating layers 110 and 120. The second trenches 140 may be formed by performing a photolithography process and a dry etching process on the laminated first and second insulating layers 110 and 120. As the second trenches 140 are formed in this manner, the laminated first and second insulating layers 110 and 120 may be patterned in a line shape.

Figure 7:
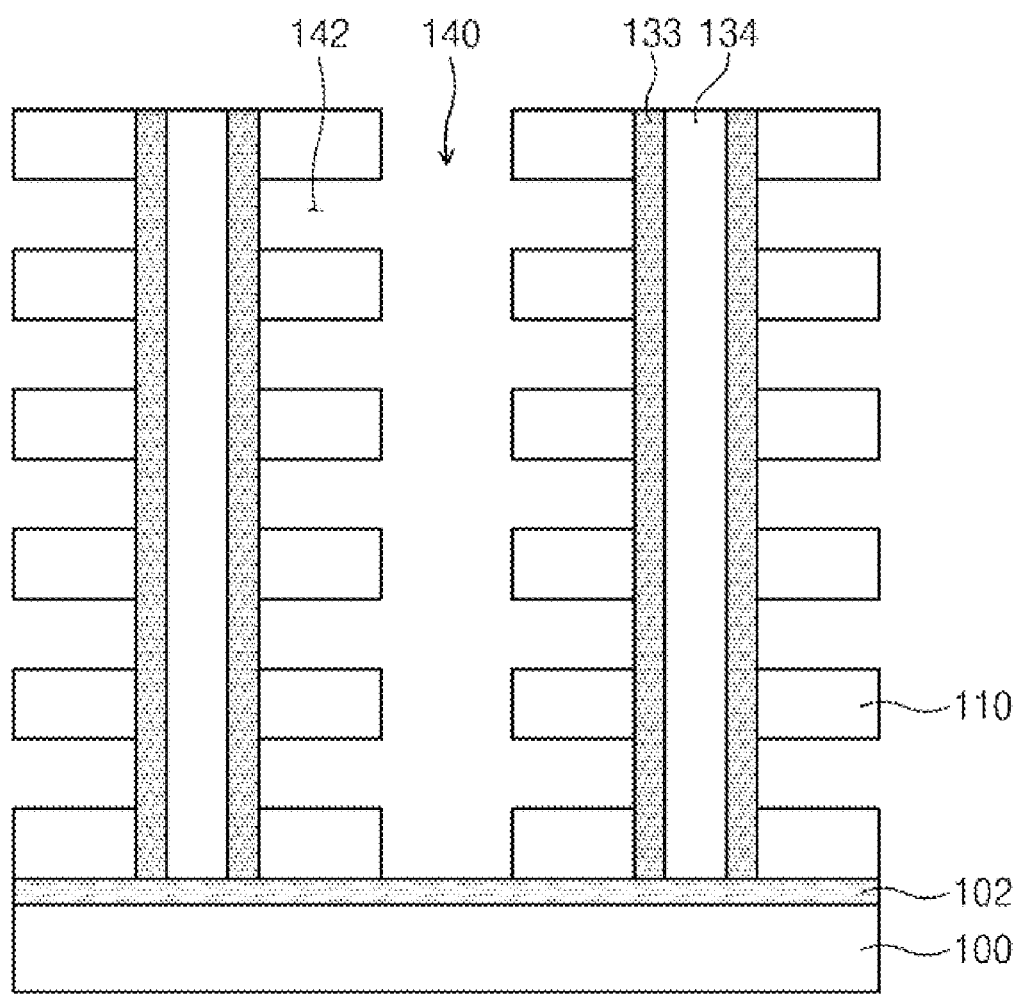

Referring to FIG. 7, the second insulating layers 120 between the laminated first insulating layers 110 are removed to form an extension portion 142 extending in a direction substantially parallel to the semiconductor substrate 100 from the second trench 140. That is, as the second insulating layers 120 are removed, the sidewall of the channel semiconductor patterns 133 may be exposed by the extension portion 142.

More specifically, a wet etching solution is supplied to the second trench 140 exposing the sidewalls of the first and second insulating layers 110 and 120. Since the first and second insulating layers 110 and 120 are formed of material having different wet etching rates, the second insulating layers 120 may be selectively etched. Accordingly, the extension portion 142 exposing the channel semiconductor patterns 133 may be formed between the first insulating layers 110.

Figure 8:
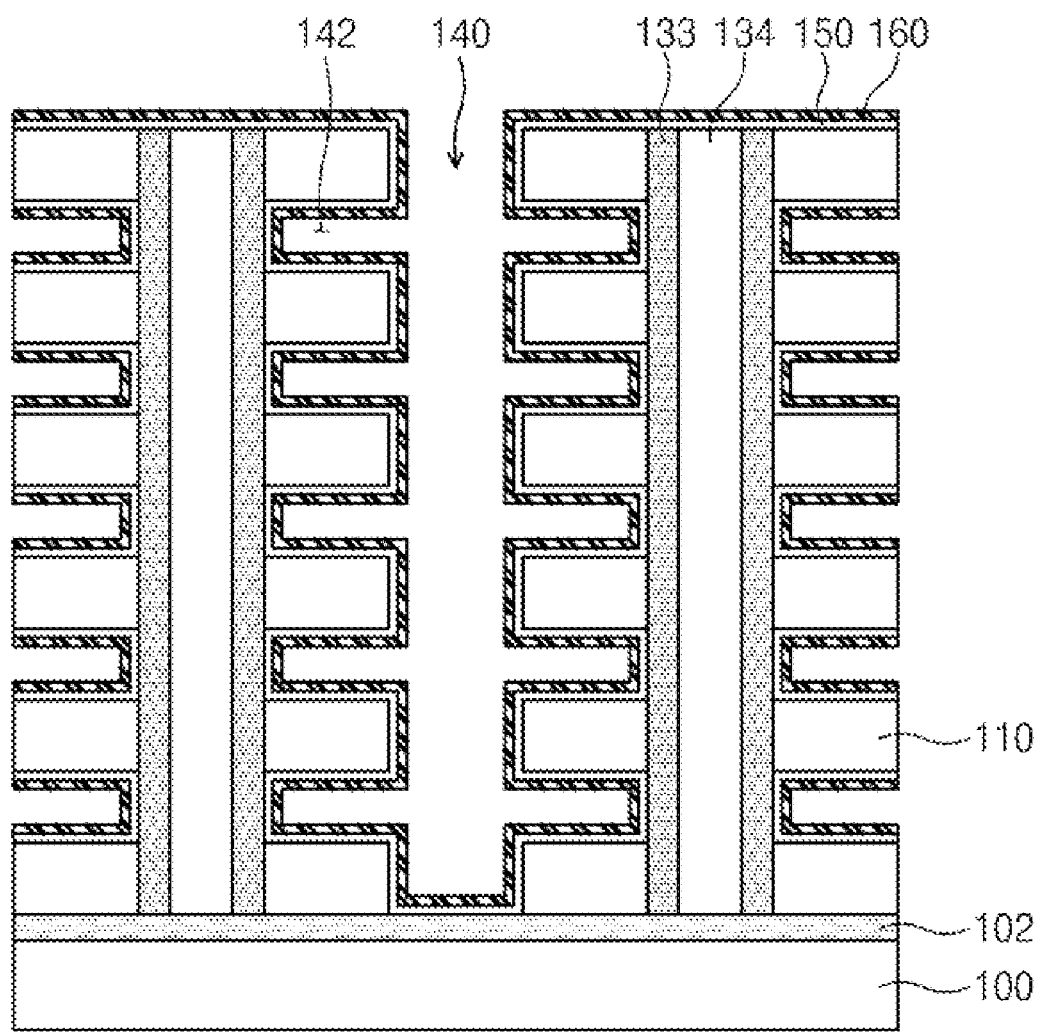

Referring to FIG. 8, a charge storage layer 150 is conformally formed along surfaces of the extension portion 142 and the second trench 140. That is, the charge storage layer 150 may be formed on a portion of sidewall of the channel semiconductor patterns 133, a second sidewall of the first insulating layer 110 and a top surface and a bottom surface of the first insulating layer 110. Before forming the channel semiconductor patterns 133, the charge storage layer 150 may be formed on the first sidewall of the first insulating layer 110 and in this case, the charge storage layer 150 may be exposed by the extension portion 142.

More specifically, the charge storage layer 150 may be formed by sequentially depositing a charge tunneling layer, a charge trapping layer and a charge blocking layer. For example, the charge tunneling layer may be formed of a silicon oxide layer (SiO2) or a silicon oxynitride layer (SiON). The charge tunneling layer may be formed of a high dielectric material such as $Al_2O_3$, $HfO_2$, $ZrO_2$, $LaO_3$, $Ta_2O_3$, $TiO_2$, $SrTiO_3$(STO), $(Ba,Sr)TiO_3$(BST) or a multilayer deposited by combinations thereof. The charge tunneling layer may be formed of material having a dielectric constant lower than that of the charge blocking layer. The charge trapping layer may be formed of a silicon nitride layer and/or a silicon oxynitride layer. The charge blocking layer may be formed of a high dielectric material such as $Al_2O_3$, $HfO_2$, $ZrO_2$, $LaO_3$, $Ta_2O_3$, $TiO_2$, $SrTiO_3$(STO), $(Ba,Sr)TiO_3$(BST) or a multilayer deposited by combinations thereof. The charge blocking layer may be formed of material having a dielectric constant higher than that of the charge tunneling layer.

Subsequently, a metal liner 160 is conformally formed along a surface of the charge storage layer 150. The metal liner 160 is formed of a conductive material having a low resistivity to reduce a resistance of a gate electrode. Further, the metal liner 160 can be formed through a chemical vapor deposition (CVD) process and an atomic layer deposition (ALD) process on a surface of the charge storage layer 150 formed in the extension portion 142. For example, the metal liner may be formed of TiN, TaN or WN.

Figure 9:
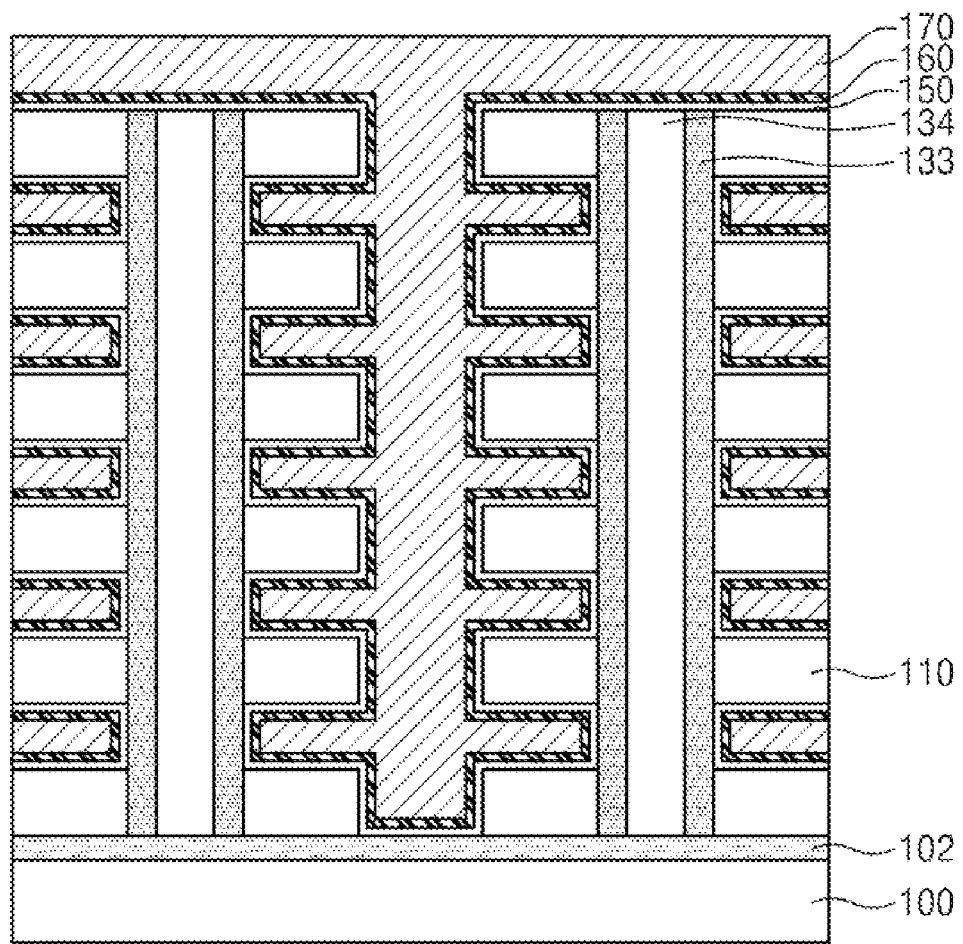

Referring to FIG. 9, a gate conductive layer 170 filling the extension portion 142 and the second trench 140 is formed on the metal liner 160. The gate conductive layer 170 may be formed by depositing a polysilicon layer.

Figure 10:
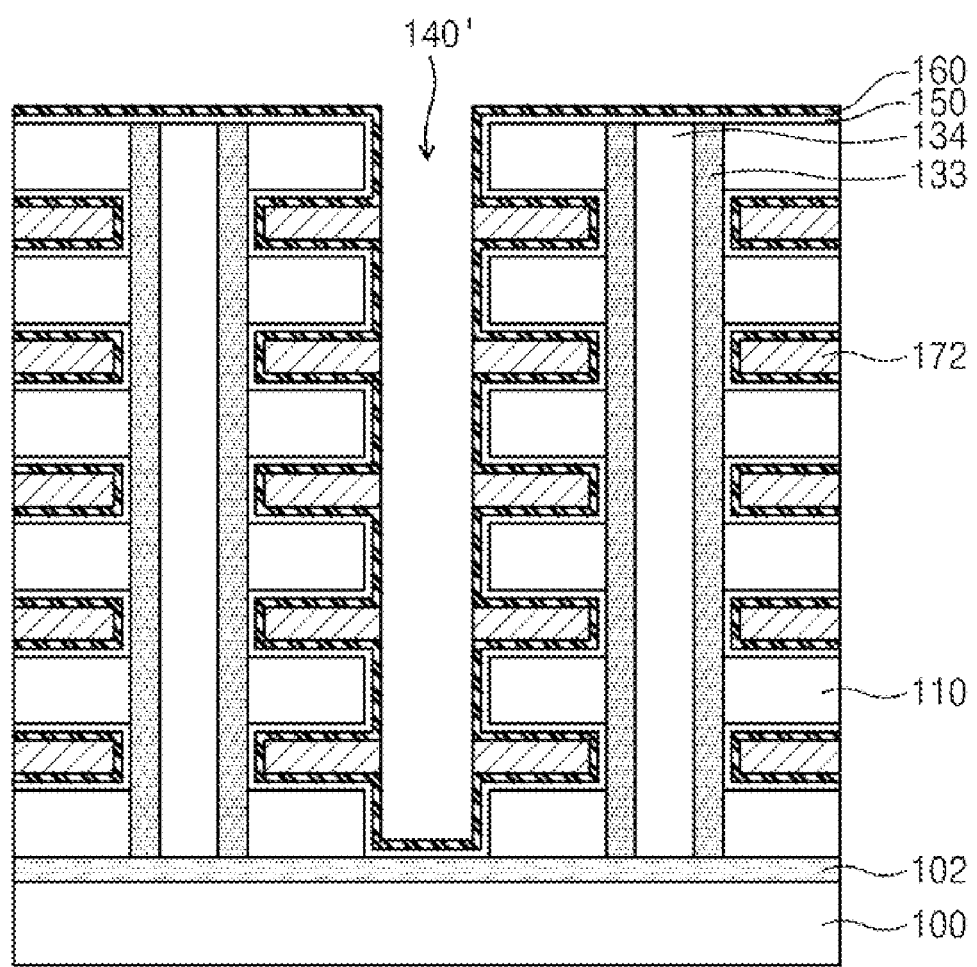

Referring to FIG. 10, a portion of the gate conductive layer 170 filling the second trench 140 is removed to form conductive patterns 172 in the extension portions 142.

More specifically, a portion of the gate conductive layer 170 is removed so that the metal liner 160 on the second sidewall of the first insulating layer 110 is exposed. That is, a third trench 140 exposing the metal liner 160 on the second sidewall of the first insulating layer 110 may be formed. Accordingly, the gate conductive layer 170 is divided into conductive patterns 172 formed in the extension portions 142 respectively. At this time, an exposed sidewall of the conductive pattern 172 may protrude from the second sidewall of the first insulating layer 110 by a thickness about equal to that of the charge storage layer 150 and the metal liner 160 formed between the conductive pattern 172 and the first insulating layer 110.

Figure 11:
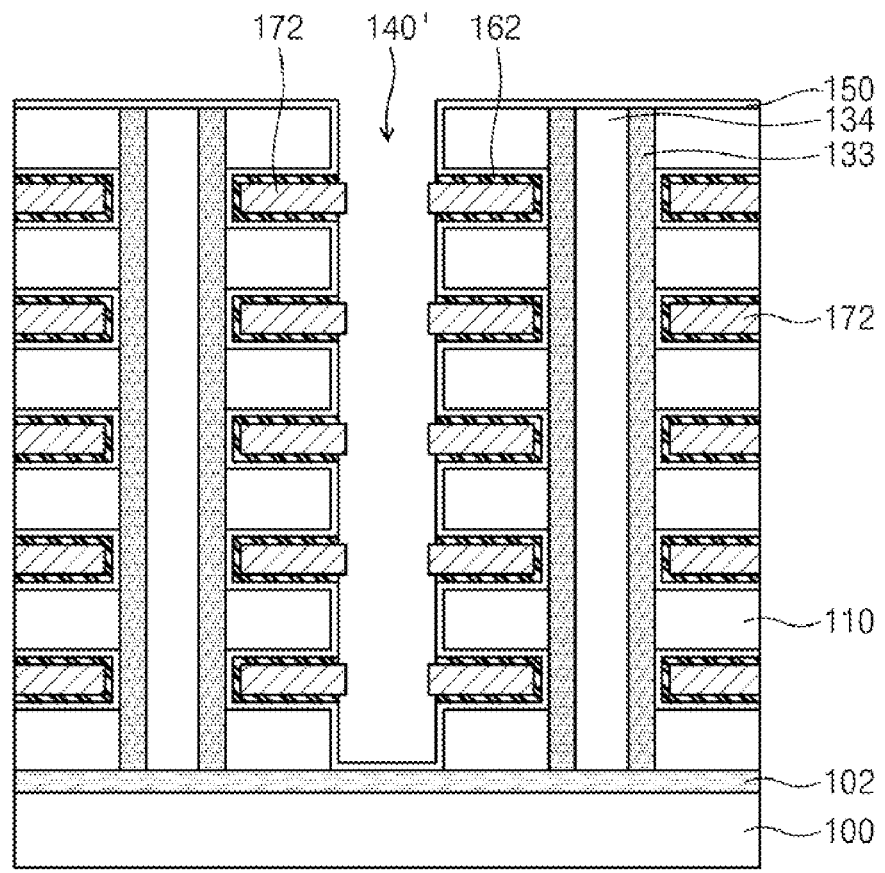

Referring to FIG. 11, the metal liner 160 on the second sidewalls of the first insulating layers 110 is removed to form metal liner patterns 162 between the first insulating layers 110 respectively. At this time, the metal liner 160 is selectively etched through a wet etching process to be divided into the metal liner patterns 162. That is, between the first insulating layers 110 vertically adjacent to each other, the metal liner pattern 162 is interposed between the charge storage layer 150 and the conductive pattern 172.

More specifically, a wet etching solution for etching the metal liner 160 is supplied into the third trench 140'. Thus, the metal liner 160 formed on the second sidewalls of the first insulating layers 110 and a top surface of the uppermost first insulating layer 110 of the stack may be etched by the wet etching solution. For example, when the metal liner 160 is formed of TiN, the mixed solution of ammonium hydroxide ($NH_4OH$), peroxide ($H_2O_2$) and the mixed solution of deionized water, sulfuric acid ($H_2SO_4$) and peroxide ($H_2O_2$) may be used as a wet etching solution. When the metal liner 160 is selectively etched, the charge storage layer 150 and the conductive pattern 172 have a high selectivity with respect to the etching solution.

As the metal liner 160 on the second sidewall of the first insulating layer 110 is removed, the conductive pattern 172 has a shape protruding from the metal liner pattern 162.

Figure 12:
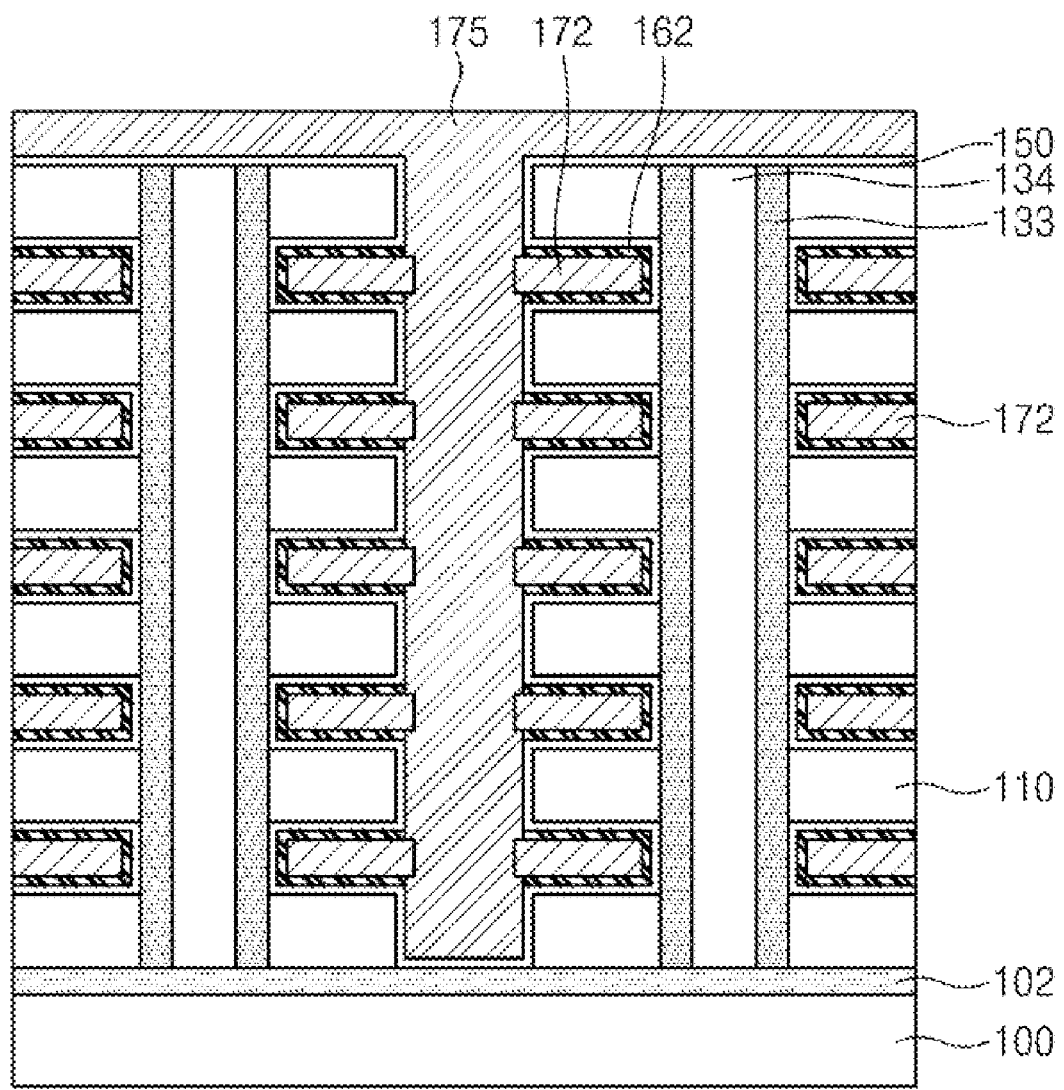

Referring to FIG. 12, a metal layer 175 fills the third trench 140' in which sidewalls of the conductive patterns 172 are exposed. The metal layer 175 may be formed of metal material such as Co, Ni, W, Mo or Ti. Subsequently, an annealing process is performed so that metal material of the metal layer 175 and silicon of the conductive pattern 172 formed of polysilicon react to each other to become silicide. A silicide layer may be formed on an interface between the metal layer 175 and the conductive pattern 172 by the silicide process.

Figure 13:
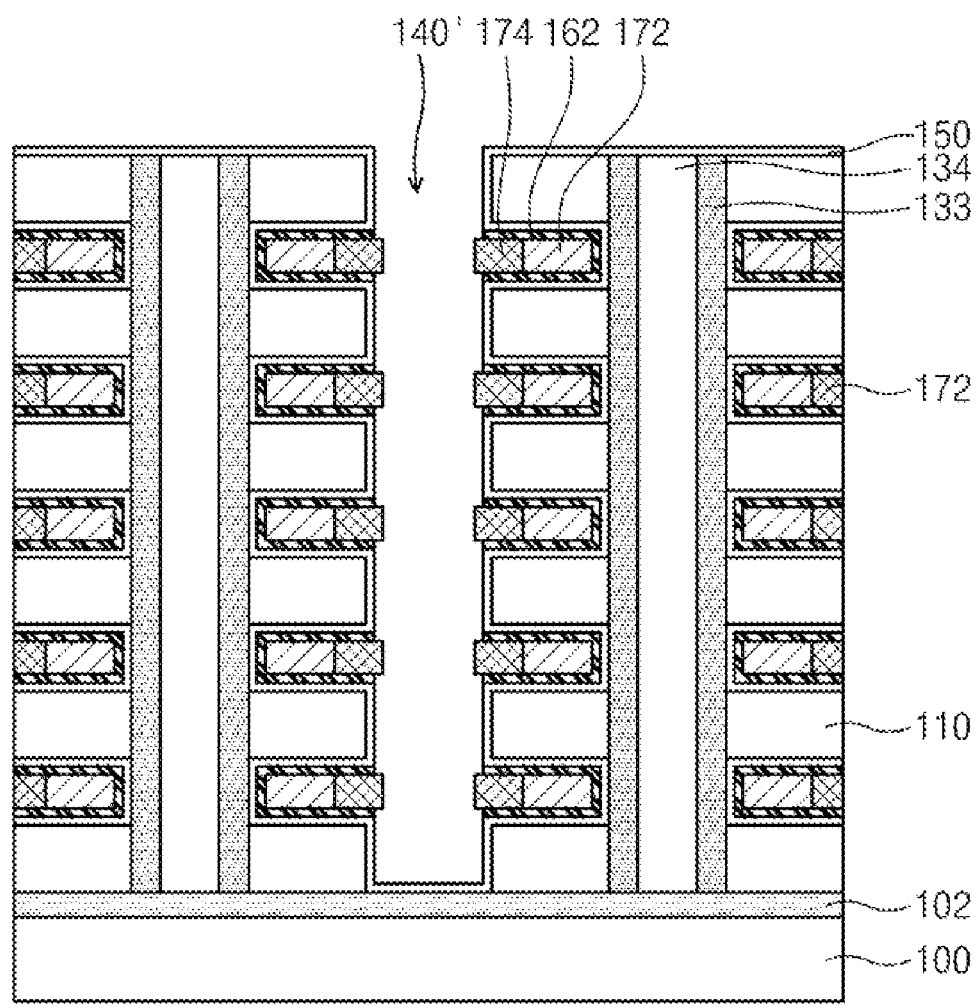

Referring to FIG. 13, after a silicide layer 174 is formed on a sidewall of the conductive pattern 172, a wet etching process is performed to remove the remaining metal layer 172, which is not silicide. A mixed solution of ammonium hydroxide ($NH_4OH$), peroxide ($H_2O_2$) may be used as an etching solution when a wet etching process is performed. Accordingly, the third trench 140' exposing the silicide layer formed on each of the extension portions 142 may be formed again. A portion of the silicide layer 174 formed in each of the extension portions 142 may protrude into the third trench 140'.

In the process of forming the silicide layer 174, when the metal layer 175 is formed of cobalt, a void (130 of FIG. 2B) may be formed between the conductive pattern 172 and the silicide layer 174 by a diffusion of cobalt and silicon during the silicide process. In this case, a physical connection between the conductive pattern 172 and the silicide layer 174 may be disconnected. However, since the metal liner pattern 162 is formed over an upper and bottom surfaces of the conductive pattern 172 and the silicide layer 174, the conductive pattern 172 and the silicide layer 174 may be electrically connected to each other by the metal liner pattern 162.

Figure 14:
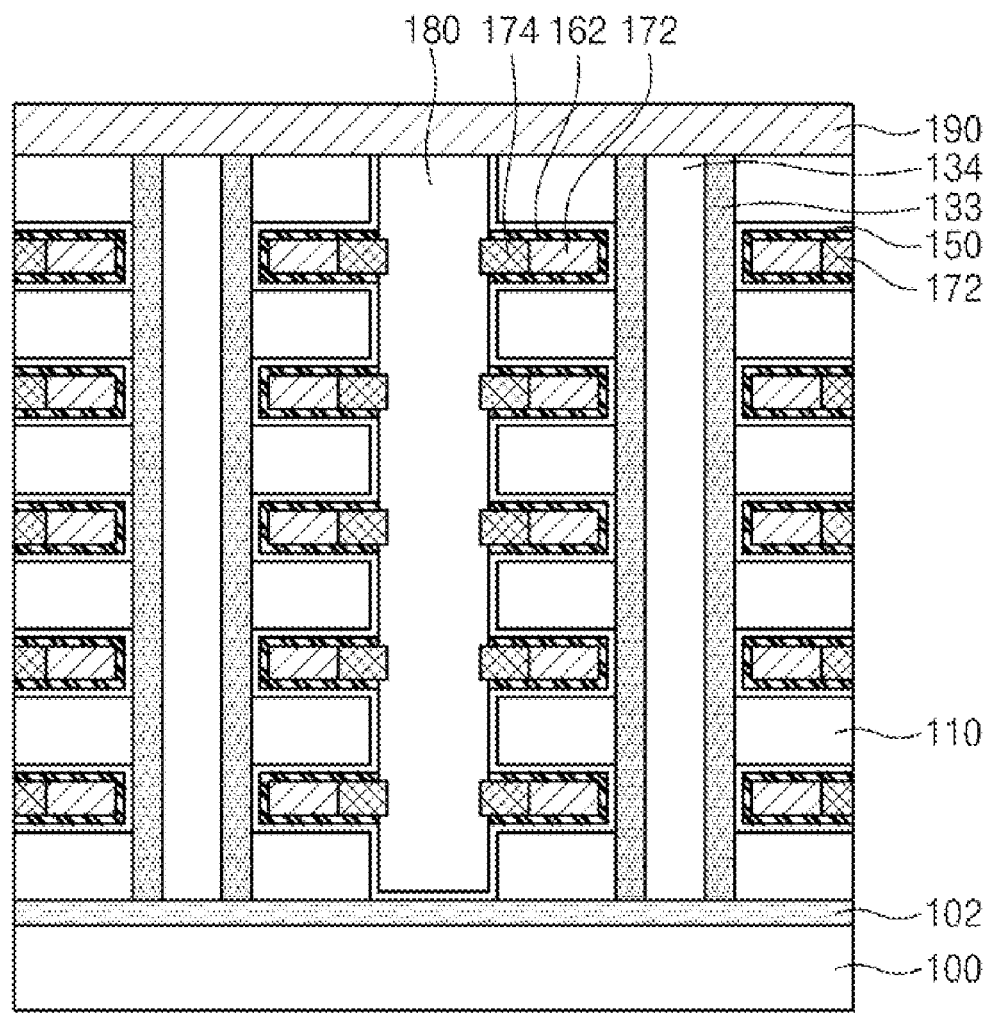

Referring to FIG. 14, an insulating layer 180 fills the third trench 140' and a top surface of the insulating layer 180 is planarized. The channel semiconductor layer formed on the first sidewall of the first insulating layer 110 is patterned in a line shape to form channel semiconductor patterns 133 (see FIGS. 2A, 2B and 3). Accordingly, the channel semiconductor patterns 133 of a line shape, which cross one sidewall of the laminated gate electrode 172 and 174 and are spaced apart from each other, may be formed (see FIGS. 4 and 5). That is, the channel semiconductor layer may be in place while the laminated gate electrode 172 and 174 is formed. Alternatively, a process of patterning the channel semiconductor layer in a line shape to form the channel semiconductor patterns 133 may be performed before forming the second trenches 140 as described with reference to FIGS. 4 and 5.

Bit lines 190 are formed, which cross the gate electrodes 172 and 174 and are electrically connected to a top surface of the channel semiconductor patterns 133, wherein the gate electrodes 172 and 174 are arranged in three dimensions.

Referring to FIGS. 15 through 20, a method of manufacturing a nonvolatile memory device in accordance with another embodiment of the inventive concept will be described in detail. FIGS. 15 through 20 are views sequentially illustrating a method of manufacturing a nonvolatile memory device in accordance with another embodiment of the inventive concept.

According to an embodiment of the inventive concept, methods for forming the extension portions between the channel semiconductor layer and the first insulating layers and forming the metal liner are substantially similar to those described with reference to FIGS. 4 through 8. Thus, further description of methods for forming the extension portions between the channel semiconductor layer and the first insulating layers will be omitted.

In another embodiment of the inventive concept, the metal liner 160 may function as a seed layer providing conductive material to a surface of the extension 142 so that metal material is selectively deposited only on an inner wall of the extension portion 142. That is, conductive material is selectively deposited on a top surface and a bottom surface of the first insulating layer 110 and a sidewall of the exposed channel semiconductor layer 132. The metal liner 160 is uniformly formed on a surface of the charge storage layer 150. The metal liner 160 is formed of material which can be formed through a chemical vapor deposition (CVD) process and an atomic layer deposition (ALD) process and is formed of material having a low resistivity. For example, the metal liner 160 may be formed of TiN, TaN or WN.

Figure 15:
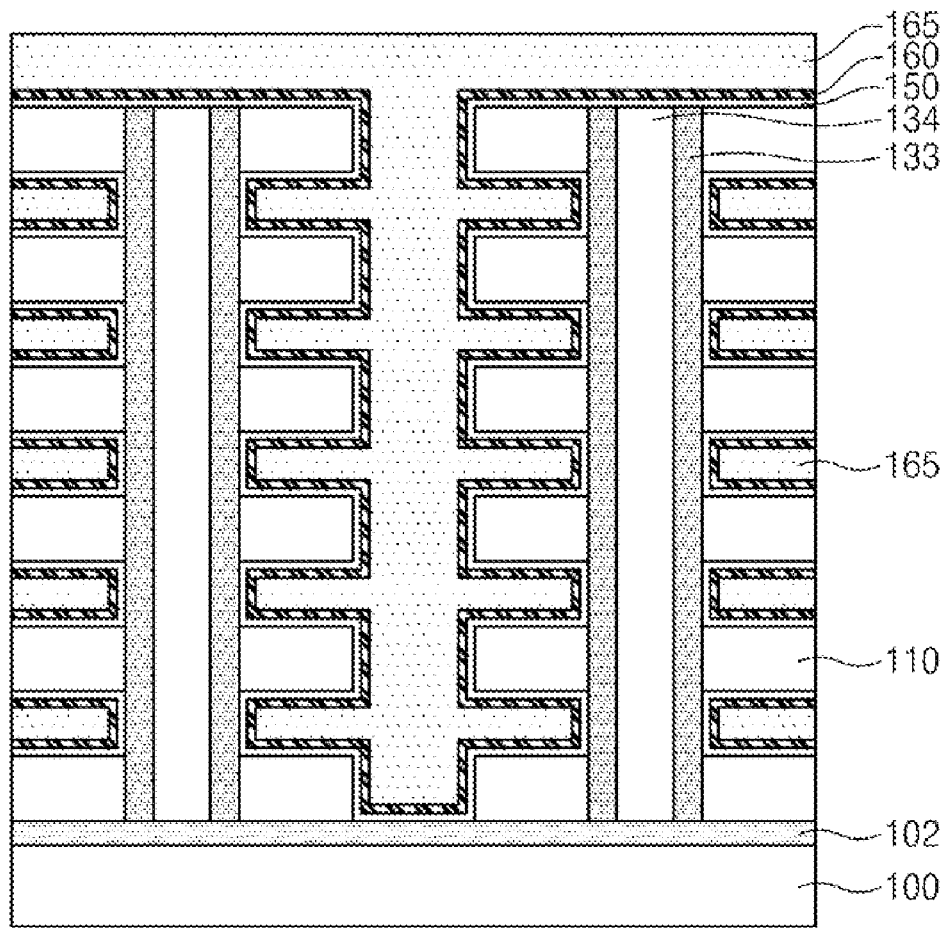
FIGS. 15 through 20 are views sequentially illustrating a method of manufacturing a nonvolatile memory device in accordance with another embodiment of the inventive concept.

Referring to FIG. 15, after the metal liner 160 is conformally formed on a surface of the charge storage layer 150, a sacrificial layer fills the extension portion 142 and the second trench 140. The sacrificial layer may be formed of material having a superior gap filling characteristic and an etching selectivity with respect to the metal liner 160 and the charge storage layer 150. For example, the sacrificial layer may be formed of a silicon oxide layer or a silicon nitride layer. The sacrificial layer may be formed to have a sufficient thickness as far as the top surface of the uppermost first insulating layer 110 of the stack. The sacrificial layer may be planarized down to the top surface of the first insulating layer 110.

Figure 16:
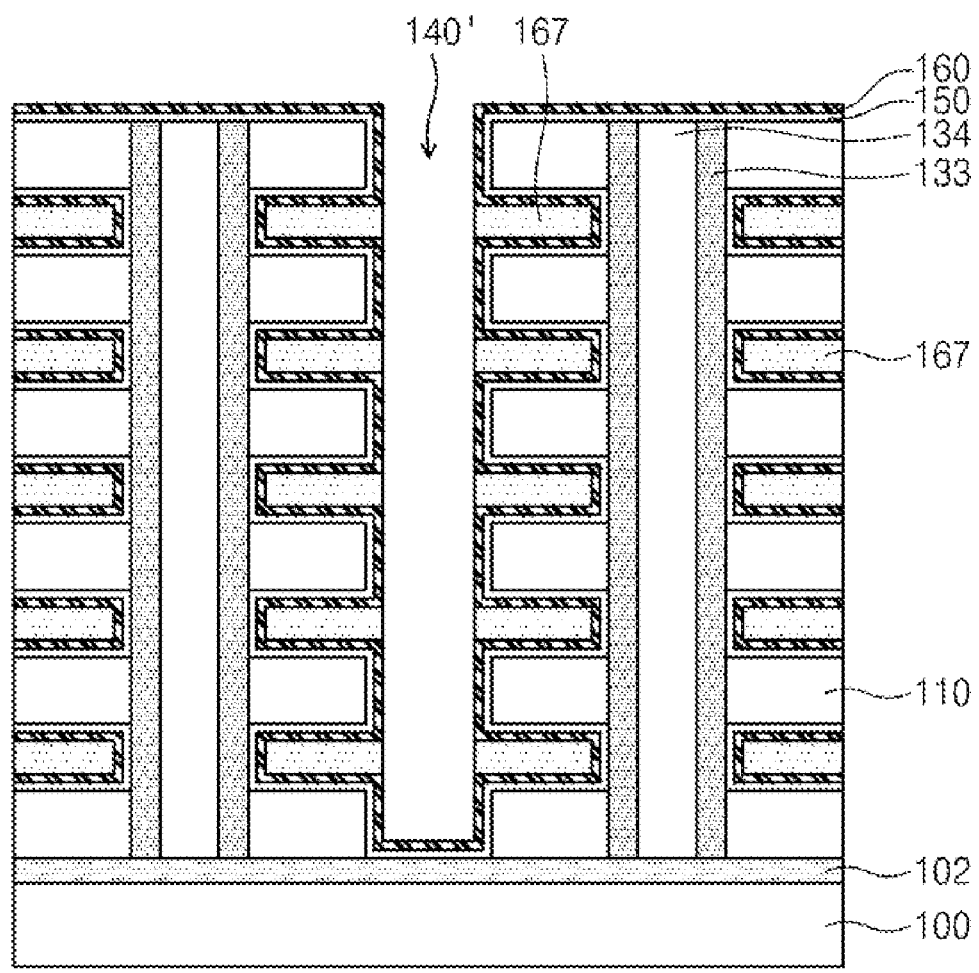

Referring to FIG. 16, the sacrificial layer may be anisotropically etched so that the metal liner 160 formed on the second sidewall of the first insulating layer 110 is exposed. Thus, the sacrificial layer remains between the first insulating layers 110 in the extension portions 142. That is, the third trench 140' exposing the metal liner 160 formed on the second sidewall of the first insulating layer 110 may be formed.

Figure 17:
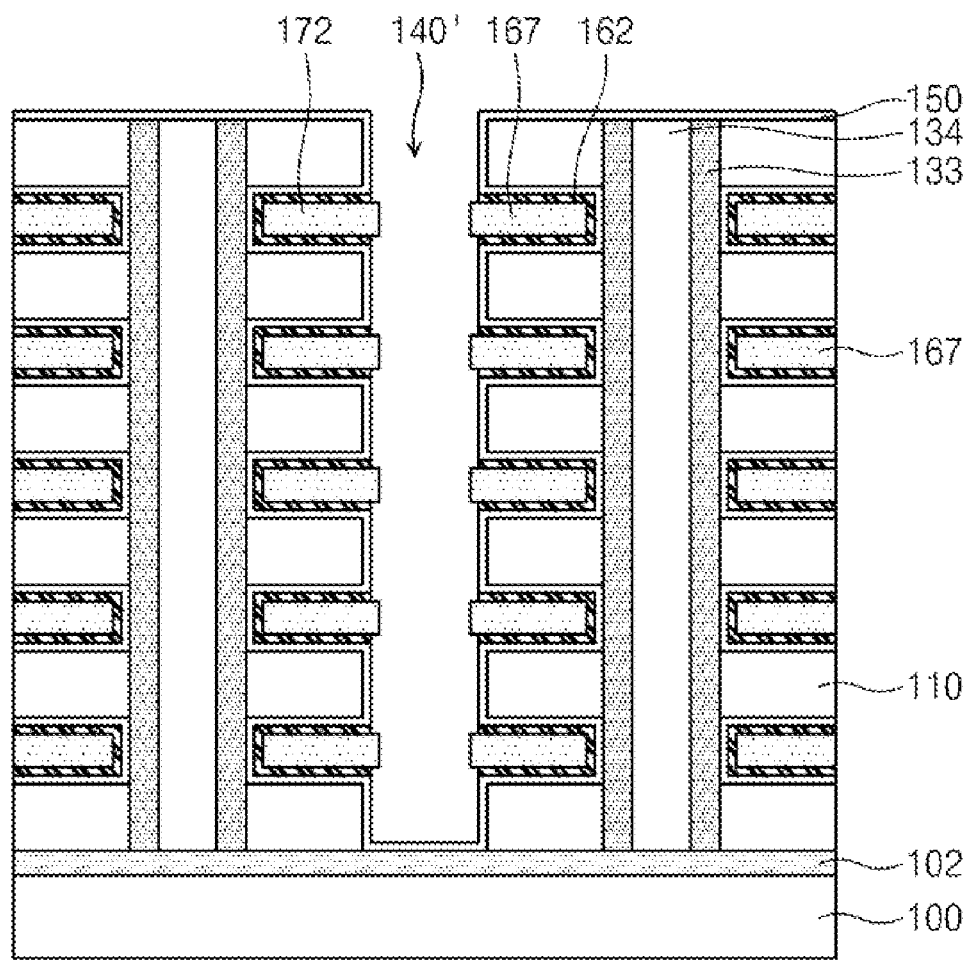

Referring to FIG. 17, a wet etching solution for removing the metal liner 160 is supplied to the third trench 140' to selectively etch the metal liner 160 exposed to the third trench 140'. That is, the metal liner 160 is etched until the charge storage layer 150 is exposed. Accordingly, the metal liner pattern 162 may be locally formed between the first insulating layers 110 in the extension portion 142 and the vertically adjacent metal liner patterns 162 are electrically separated from one another.

Figure 18:
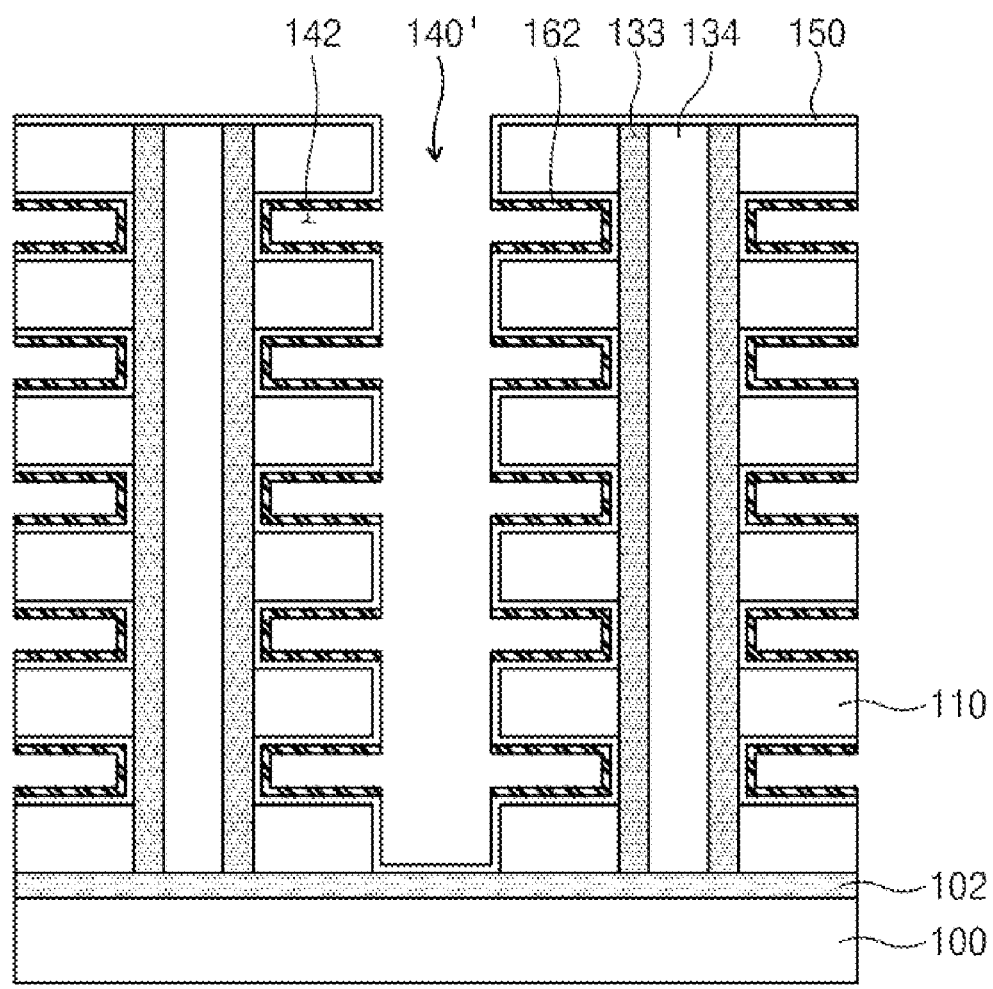

Referring to FIG. 18, after forming the metal liner pattern 162, a sacrificial layer remaining in the extension portion 142 is removed using a wet etching solution. That is, a surface of the metal liner pattern 162 formed in the extension portion 142 is exposed.

Figure 19:
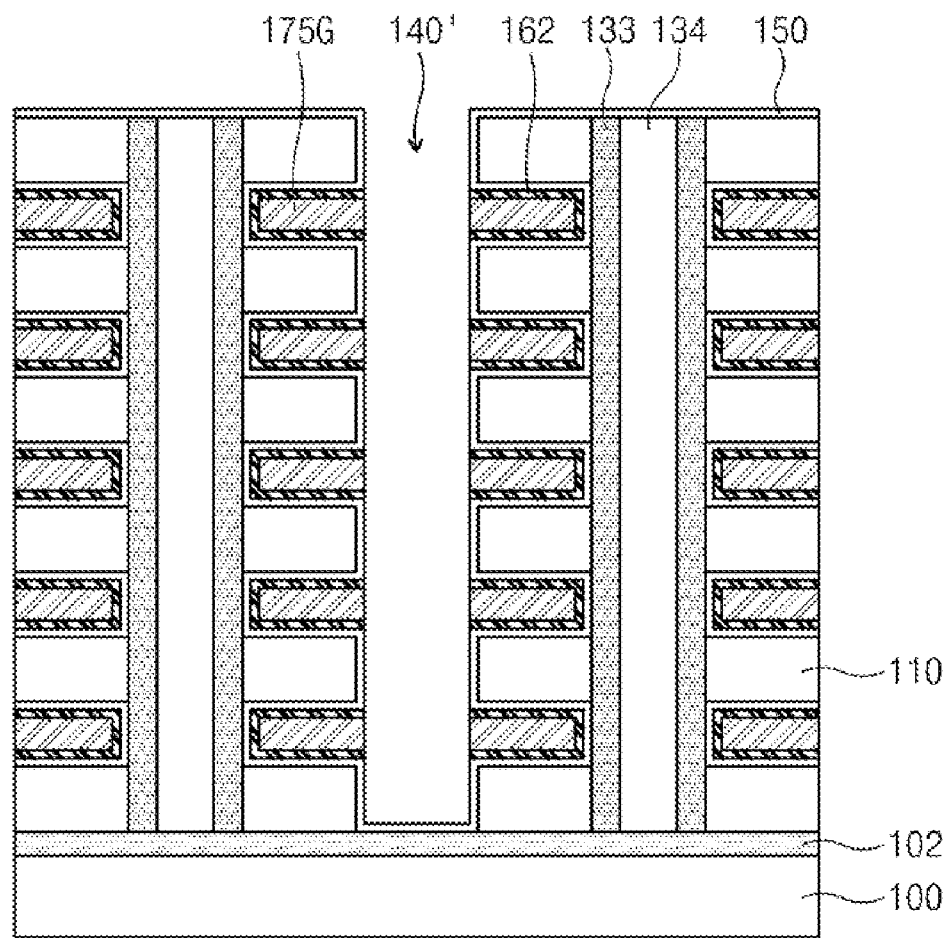

Referring to FIG. 19, metal material fills the extension portion 142 having exposed metal liner pattern 162 to form gate electrodes 175G. The gate electrode 175G may be formed in the extension portion 142 using a selective chemical vapor deposition process or a selective electroless vapor deposition process. The selective chemical vapor deposition process or the selective electroless vapor deposition process have a property such that conductive material is not deposited on a surface of an insulating layer such as a silicon oxide layer but is selectively deposited only on the metal liner pattern 162 composed of conductive material. That is, a chemical reaction forming metal material is induced on a conductive surface, so metal material may be selectively deposited only in the extension portion 142. Accordingly, the metal liner pattern 162 formed on an inner wall of the extension portion 142 functions as a seed layer on which metal material is formed. The selective deposited material may be, for example, Co, Ni, W, Mo or Ti.

Since metal material can be selectively deposited on the metal liner pattern 162, the gate electrode 175G may be locally formed in the extension portion 142. Thus, after a metal layer for a gate electrode is deposited, a patterning process to form the gate electrode 175G is not needed. That is, the gate electrode 175G may be locally formed of metal material between the first insulating layers 110

Figure 20:
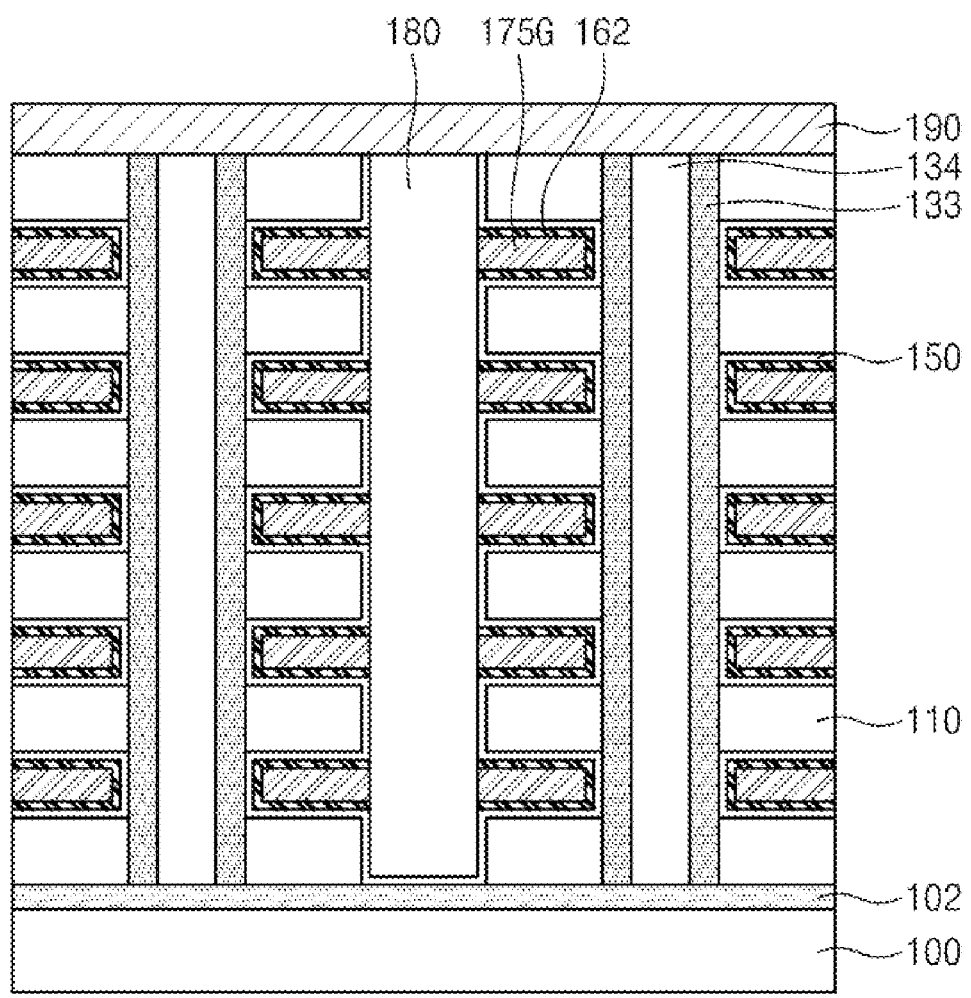

Referring to FIG. 20, an insulating layer 180 fills the second trench 140 and the insulating layer 180 is planarized.

The channel semiconductor layer formed on the first sidewall of the first insulating layer 110 is patterned in a line shape to form channel semiconductor patterns 133 (see FIGS. 4 and 5). Thus, the channel semiconductor patterns 133 of a line shape which cross one sidewalls of the laminated gate electrode 175G and are spaced apart from one another may be formed. That is, the channel semiconductor layer may be in place while the gate electrode 175G is formed. Alternatively, a process of patterning the channel semiconductor layer in a line shape to form the channel semiconductor patterns 133 may be performed before forming the second trenches 140 as described with reference to FIGS. 4 and 5.

Subsequently, bit lines 190 are formed, which cross the gate electrodes 175G and are electrically connected to a top surface of the channel semiconductor patterns 133, wherein the gate electrodes 175G are arranged in three dimensions.

In another embodiment of the inventive concept, after forming the metal liner 160 shown in FIG. 8, a metal layer is continuously deposited in the extension portion 142 and the second trench 140, and then the metal layer and the metal liner 160 are patterned to locally form a metal liner pattern and a metal pattern in the extension portion 142. In this case, since an etching selectivity of the metal layer relative to the metal liner 160 is small, the metal layer may not completely fill the extension portion 142. Alternatively, as described with reference to FIGS. 19 and 20, after the metal liner 160 is formed, the metal liner pattern 162 may be locally formed in the extension portion 142 using a sacrificial layer.

Figure 21:
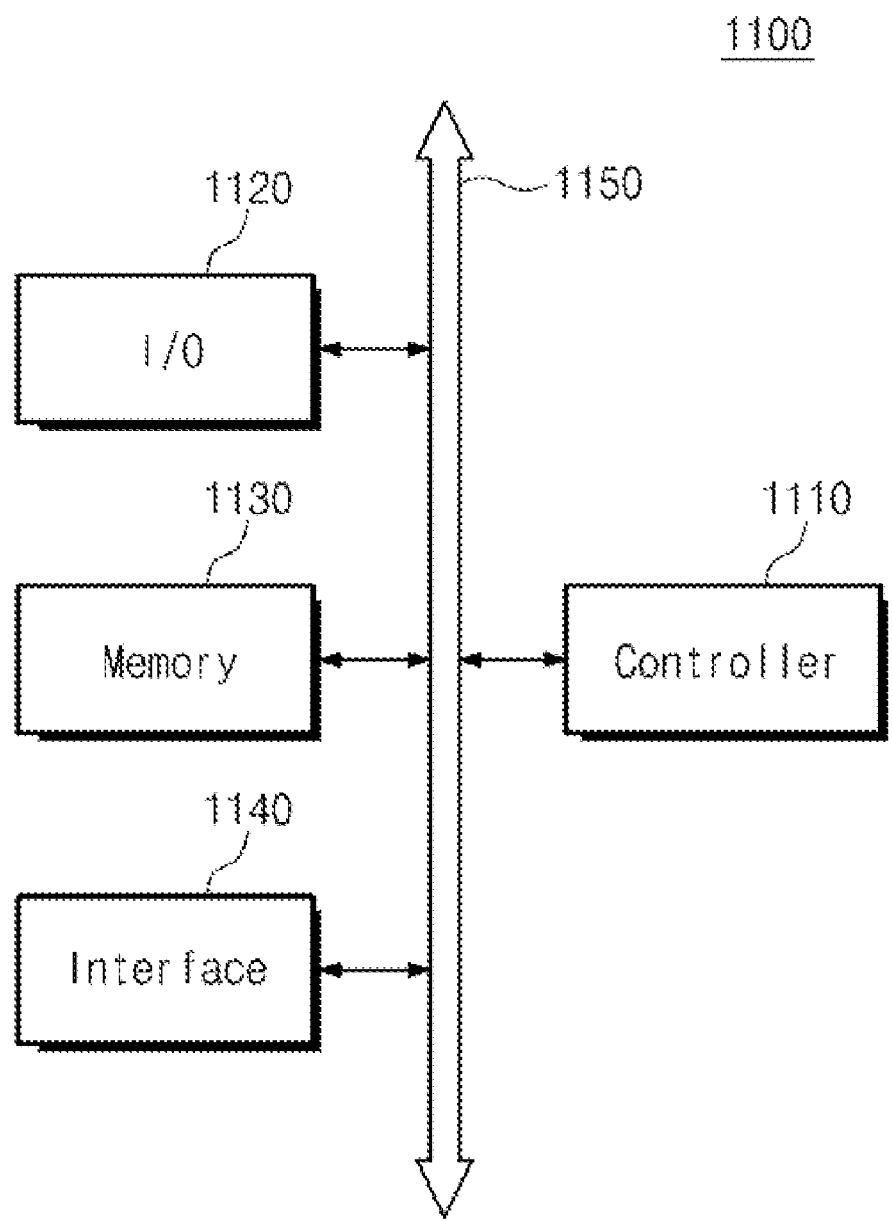
FIG. 21 is a block diagram illustrating an example of a memory system including a nonvolatile memory device in accordance with embodiments of the inventive concept.

FIG. 21 is a block diagram illustrating an example of a memory system including a nonvolatile memory device in accordance with embodiments of the inventive concept.

Referring to FIG. 21, a memory system 1100 can be implemented in, for example, a portable digital assistant (PDA), a portable computer, a tablet, a wireless phone, a mobile phone, a digital music player, a memory card or devices which can transmit and/or receive data in a wireless environment.

The memory system 1100 includes a controller 1110, an input/output device 1120 such as a keypad, a keyboard and a displayer, a memory 1130, an interface 1140 and a bus 1150. The memory 1130 and the interface 1140 communicate through the bus 1150.

The controller 1110 includes at least one of a microprocessor, digital signal processor, microcontroller or other processor type device. The memory 1130 may be used to store commands executed by the controller 1110. The input/output device 1120 may receive data or a signal from an external device or may output data or a signal to an external device. For example, the input/output device 1120 may include a keyboard, a keypad or a display device.

The memory 1130 includes a nonvolatile memory device in accordance with embodiments of the inventive concept. The memory 1130 may further include a different kind of memory, a random access volatile memory and various kinds of memories.

The interface 1140 transmits data to a communication network or receives data from a communication network.

Figure 22:
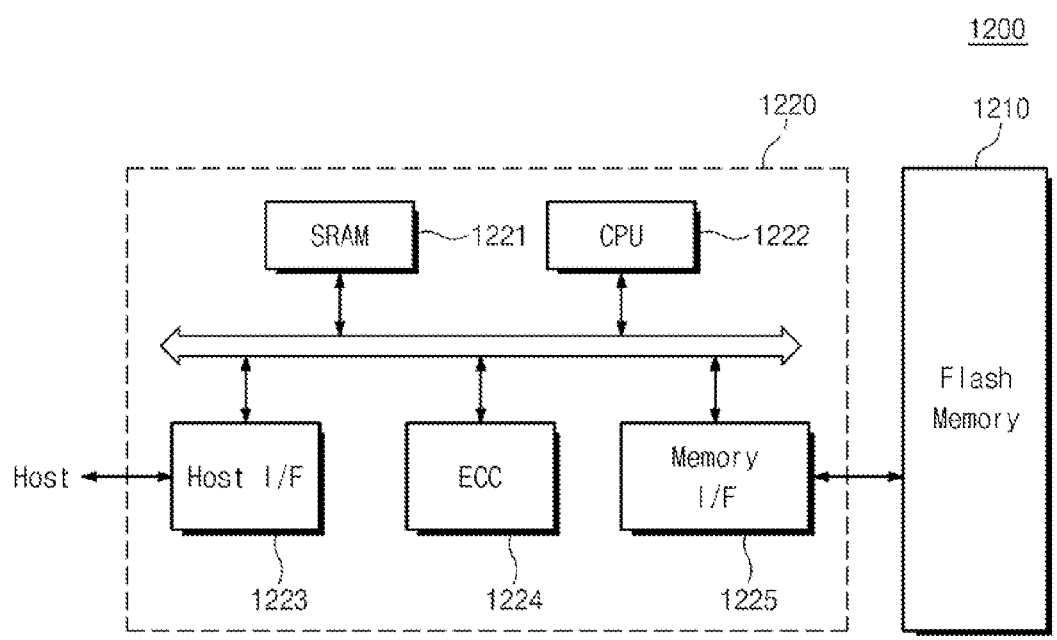
FIG. 22 is a block diagram illustrating an example of a memory card including a nonvolatile memory device in accordance with an embodiment of the inventive concept.

FIG. 22 is a block diagram illustrating an example of a memory card including a nonvolatile memory device in accordance with an embodiment of the inventive concept.

Referring to FIG. 22, a flash memory device 1210 in accordance with the inventive concept is built in a memory card 1200. The memory card 1200 in accordance with the inventive concept includes a memory controller 1220 controlling data exchange between a host and the flash memory device 1210.

Static Random Access Memory (SRAM) 1221 may be used as an operation memory of a processor 1222 (e.g., a Central Processing Unit (CPU)). A host interface 1223 includes a data exchange protocol of the host connected to the memory card 1200. An error correction block 1224 including error-correcting code (ECC) for detecting and correcting an error in data readout from the multi-bit flash memory device 1210. A memory interface (I/F) 1225 interfaces with the flash memory device 1210. The processor 1222 performs control operations to exchange data of the memory controller 1220. Even though not depicted in a drawing, the memory card 1200 in accordance with an embodiment of the inventive concept may further include Read-Only Memory (ROM) (not shown) storing code data for interfacing with the host.

Figure 23:
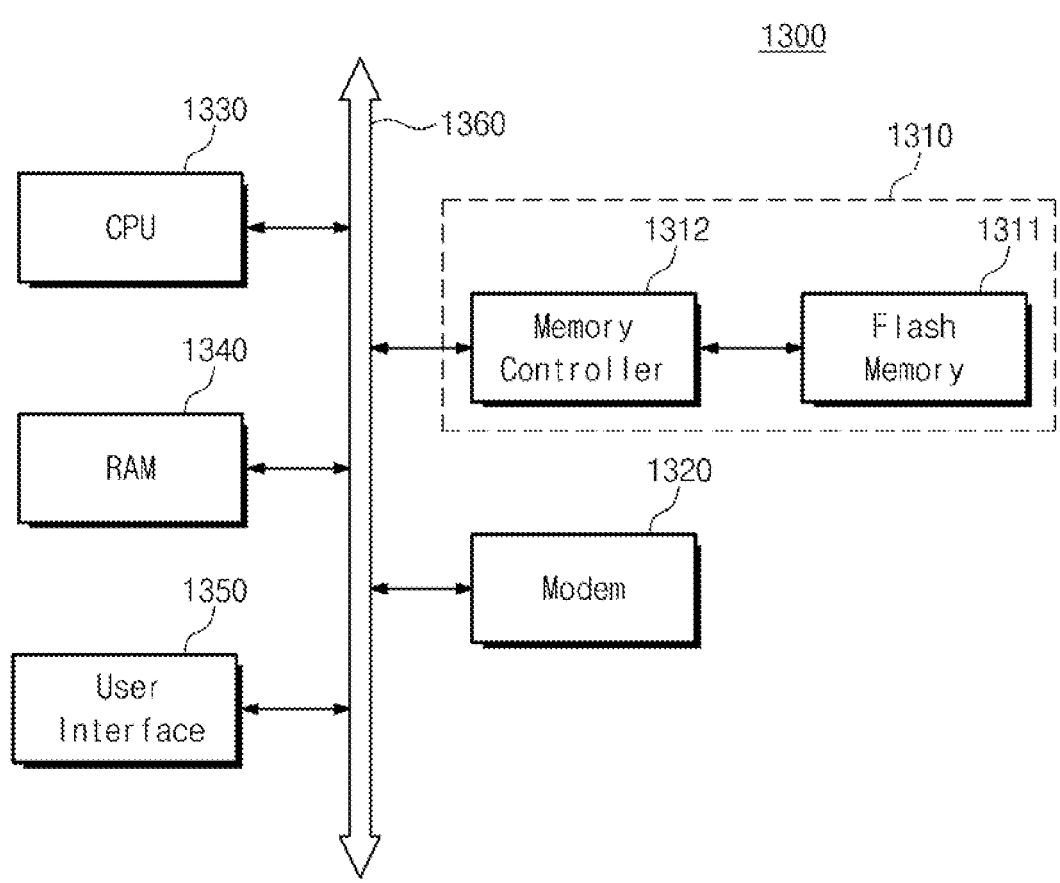
FIG. 23 is a block diagram illustrating an example of a data processing system fitted with a nonvolatile memory device in accordance with the inventive concept.

FIG. 23 is a block diagram illustrating an example of a data processing system fitted with a nonvolatile memory device in accordance with an embodiment of the inventive concept.

Referring to FIG. 23, a flash memory system 1310 in accordance with the inventive concept is built in a data processing system 1300 such as a mobile device or a desk top computer. The data processing system 1300 includes the flash memory system 1310 and a modem 1320, a processor 1330 (e.g., CPU), a RAM 1340 and a user interface 1350 that are electrically connected to a system bus 1360 respectively. The flash memory system 1310 may be similar to the memory system or the flash memory system described above. The flash memory system 1310 stores data processed by the processor 1330 or data received from an external device. Here, the flash memory system 1310 may be comprised of a Solid State Disk (SSD) and in this case, the data processing system 1300 may stably store data in the flash memory system 1310. As reliability increases, the flash memory system 1310 can reduce resources needed to correct an error, so the flash memory system 1310 may provide a data exchange function of high speed to the data processing system 1300. Even though not depicted in a drawing, the data processing system 1300 may further include an application chipset, a camera image processor (CIS), an input/output device, etc.

The flash memory device or the memory system in accordance with an embodiment of the inventive concept may be mounted by various types of packages. For example, the flash memory device or the memory system in accordance with an embodiment of the inventive concept is packaged by methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and may be mounted.

A nonvolatile memory device in accordance with an embodiment of the inventive concept and a method of manufacturing the same, a gate electrode including a silicide layer or a metal layer is formed to reduce a resistance of a gate electrode three dimensionally arranged on a semiconductor substrate.

As a metal liner pattern is formed on a portion of surface of a gate electrode including a silicide layer, a voltage is stably supplied to a gate electrode.

When a gate electrode is formed of a metal layer, since metal material is selectively deposited only on a surface of a metal liner pattern, a process for patterning a gate electrode is not needed.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
a plurality of gate electrodes three dimensionally arranged on a semiconductor substrate;
a semiconductor pattern extending from the semiconductor substrate and crossing sidewalls of the gate electrodes;
a metal liner pattern formed between the semiconductor pattern and the gate electrode and formed on a top surface and a bottom surface of each of the gate electrodes; and
a charge storage layer formed between the semiconductor pattern and the metal liner pattern.

2. The nonvolatile memory device of claim 1, wherein each of the gate electrodes comprises:
a polycrystalline semiconductor layer adjacent to the semiconductor pattern; and
a silicide layer formed on one sidewall of the polycrystalline semiconductor layer.

3. The nonvolatile memory device of claim 2, wherein the metal liner pattern covers a top surface and a bottom surface of the polycrystalline semiconductor layer and a top surface and a bottom surface of the silicide layer.

4. The nonvolatile memory device of claim 2, wherein the metal liner pattern electrically connects the polycrystalline semiconductor layer and the silicide layer.

5. The nonvolatile memory device of claim 1, wherein the metal liner pattern comprises one of TiN, TaN and WN.

6. A nonvolatile memory device comprising:
a plurality of gate electrodes three dimensionally arranged on a semiconductor substrate;
a semiconductor pattern extending from the semiconductor substrate and crossing first sidewalls of the gate electrodes;
an insulating layer extending from the semiconductor substrate and crossing second sidewalls of the gate electrodes and spaced apart from the semiconductor pattern;
a metal liner pattern formed between the semiconductor pattern and the gate electrodes and formed on a top surface and a bottom surface of each of the gate electrodes; and
a charge storage layer formed between the semiconductor pattern and the metal liner pattern,
wherein the gate electrodes, the metal liner, and charge storage layer each contact the insulating layer.

7. The nonvolatile memory device of claim 6, wherein each of the gate electrodes comprises:
a polycrystalline semiconductor layer adjacent to the semiconductor pattern; and
a silicide layer formed on one sidewall of the polycrystalline semiconductor layer.

8. The nonvolatile memory device of claim 7, wherein the metal liner pattern covers a top surface and a bottom surface of the polycrystalline semiconductor layer and a top surface and a bottom surface of the silicide layer.

9. The nonvolatile memory device of claim 7, wherein the metal liner pattern electrically connects the polycrystalline semiconductor layer and the silicide layer.

10. The nonvolatile memory device of claim 6, wherein the metal liner pattern comprises one of TiN, TaN and WN.

* * * * *